(12) United States Patent
Hwang et al.

(10) Patent No.: US 12,400,701 B2
(45) Date of Patent: Aug. 26, 2025

(54) MEMORY DEVICE FOR PERFORMING SMART REFRESH OPERATION AND METHOD OF REDUCING POWER CONSUMPTION DURING REFRESH

(71) Applicant: SK hynix Inc., Icheon-si (KR)

(72) Inventors: Jeong Jin Hwang, Icheon-si (KR); Sung Nyou Yu, Icheon-si (KR); Duck Hwa Hong, Icheon-si (KR); Sang Ah Hyun, Icheon-si (KR); Soo Hwan Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 18/535,647

(22) Filed: Dec. 11, 2023

(65) Prior Publication Data

US 2024/0112718 A1    Apr. 4, 2024

Related U.S. Application Data

(62) Division of application No. 17/521,331, filed on Nov. 8, 2021, now Pat. No. 11,881,246.

(60) Provisional application No. 63/125,174, filed on Dec. 14, 2020, provisional application No. 63/125,188, filed on Dec. 14, 2020.

(30) Foreign Application Priority Data

Jul. 12, 2021    (KR) .................. 10-2021-0091220

(51) Int. Cl.
G11C 11/406    (2006.01)
G11C 11/408    (2006.01)

(52) U.S. Cl.
CPC .. *G11C 11/40615* (2013.01); *G11C 11/40603* (2013.01); *G11C 11/4085* (2013.01); *G11C 11/406* (2013.01); *G11C 11/40618* (2013.01)

(58) Field of Classification Search
CPC ........ G11C 11/40615; G11C 11/40603; G11C 11/4085; G11C 11/406; G11C 11/40618
See application file for complete search history.

(56) References Cited

U.S. PATENT DOCUMENTS 9,653,139 B1 *   5/2017   Park .................. G11C 11/40615
2015/0162071 A1   6/2015   Yoon et al.
2015/0170746 A1 * 6/2015   Oowada ................. G11C 16/10
                                                 365/185.18

(Continued)

FOREIGN PATENT DOCUMENTS

KR    1020170112786 A    10/2017
KR    1020190128890 A    11/2019
KR    1020190130262 A    11/2019

*Primary Examiner* — Mushfique Siddique
(74) *Attorney, Agent, or Firm* — WILLIAM PARK & ASSOCIATES LTD.

(57) ABSTRACT

An electronic device includes a target address generation circuit configured to generate a counting signal by counting the number of times each logic level combination of an address is input by performing an internal read operation and an internal write operation during an active operation, configured to store the counting signal as the storage counting signal when the counting signal is counted more than a storage counting signal that is stored therein, and configured to store the address, corresponding to the counting signal, as a target address; and a refresh control circuit configured to control a smart refresh operation on the target address.

12 Claims, 19 Drawing Sheets

(56) References Cited

U.S. PATENT DOCUMENTS

| | | |
|---|---|---|
| 2016/0225435 A1 | 8/2016 | Lee |
| 2016/0329089 A1* | 11/2016 | Lim .................. G11C 11/406 |
| 2018/0061476 A1 | 3/2018 | Kim |
| 2018/0090196 A1 | 3/2018 | Ka |
| 2018/0165024 A1 | 6/2018 | Baek et al. |
| 2018/0174638 A1 | 6/2018 | Ku et al. |
| 2019/0347019 A1 | 11/2019 | Shin et al. |
| 2019/0348107 A1 | 11/2019 | Shin et al. |

* cited by examiner

MEMORY DEVICE FOR PERFORMING SMART REFRESH OPERATION AND METHOD OF REDUCING POWER CONSUMPTION DURING REFRESH

CROSS-REFERENCE TO RELATED APPLICATION

The present application is a divisional application of U.S. patent application Ser. No. 17/521,331, filed on Nov. 8, 2021, and claims priority under 35 U.S.C. § 119(a) to U.S. Application Ser. No. 63/125,188 filed on Dec. 14, 2020, U.S. Application Ser. No. 63/125,174 filed on Dec. 14, 2020 and Korean Patent Application No. 10-2021-0091220 filed on Jul. 12, 2021, in the Korean Intellectual Property Office, the entire disclosure of which is incorporated herein by reference in its entirety.

BACKGROUND

1. Technical Field

Embodiments of the present disclosure may generally relate to an electronic device for performing a smart refresh operation by counting the number of times each of the logic level combination of an address is input.

2. Related Art

A semiconductor device includes a plurality of memory cells for storing data. Each memory cell is configured by a cell capacitor and a cell transistor. The semiconductor device stores data through an operation of charging or discharging charge to or from the cell capacitor, and the amount of charge stored in the cell capacitor should ideally be always constant. However, the amount of charge stored in the cell capacitor varies due to a voltage difference from a peripheral circuit. A variation in the amount of charge stored in the cell capacitor means that the data that is stored in the cell capacitor varies, and this means the loss of the stored data. The semiconductor device performs a refresh operation to prevent such a data loss phenomenon.

As the processing technology is developed, the degree of integration of the semiconductor device gradually increases. Thus, the gap between memory cells decreases, and the gap between word lines coupled to the memory cells, respectively, decreases. If the gap between the word lines decreases, as an interference effect occurs between the adjacent word lines, it may be difficult to maintain data that is stored in the memory cells that are coupled to the corresponding word lines. That is to say, the probability of data to be lost increases.

SUMMARY

In an embodiment, an electronic device may include: a target address generation circuit configured to generate a counting signal by counting the number of times each logic level combination of an address is input by performing an internal read operation and an internal write operation during an active operation, configured to store the counting signal as the storage counting signal when the counting signal is counted more than a storage counting signal that is stored therein, and configured to store the address, corresponding to the counting signal, as a target address; and a refresh control circuit configured to control a smart refresh operation on the target address.

In an embodiment, an electronic device may include: a target address generation circuit configured to generate a counting signal by counting the number of times each logic level combination of an address is input by performing an internal read operation and an internal write operation during an active operation, configured to store the counting signal as a storage counting signal when the counting signal is up-counted, store the address, corresponding to the counting signal, as a target address, initialize the storage counting signal during a first smart refresh operation, and output the target address during a second smart refresh operation; and a refresh control circuit configured to control a smart refresh operation on the target address during the second smart refresh operation.

In an embodiment, a smart refresh method may include: performing an internal read and internal write operation that generate a counting signal by counting the number of times each logic level combination of an address is input during an active operation; generating a target address by generating a flag signal by comparing the counting signal and a storage counting signal, and generating a target address for performing a smart refresh operation, from the address based on the flag signal; and performing a smart refresh execution by performing the smart refresh operation of refreshing word lines that are adjacent to a word line, among word lines that are included in a memory region, corresponding to the target address, when a refresh command is input.

DETAILED DESCRIPTION

Figure 1:
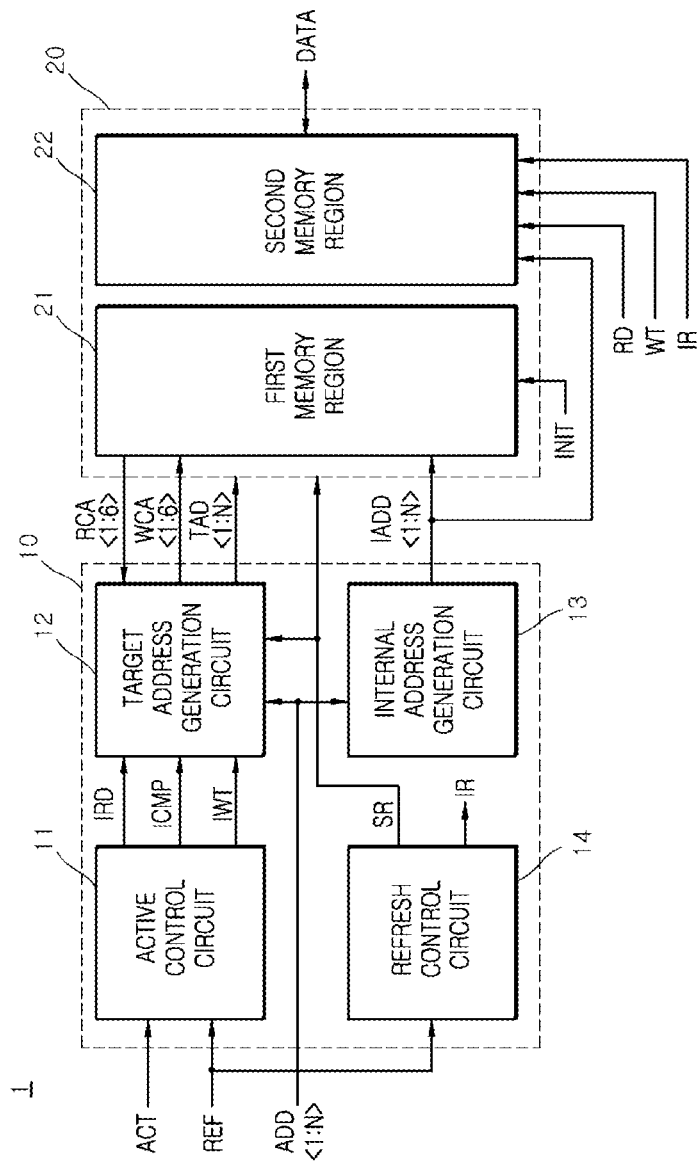
FIG. 1 is a block diagram illustrating a configuration of an electronic device in accordance with an embodiment of the present disclosure.

The term "preset" means that the numerical value of a parameter is predetermined when the parameter is used in a process or algorithm. According to an embodiment, the numerical value of the parameter may be set when the process or algorithm is started or while the process or algorithm is performed.

Terms such as "first" and "second," which are used to distinguish among various components, are not limited by the components. For example, a first component may be referred to as a second component, and vice versa.

When one component is referred to as being "coupled" or "connected" to another component, it should be understood that the components may be directly coupled or connected to each other or coupled or connected to each other through still another component interposed therebetween. On the other hand, when one component is referred to as being "directly coupled" or "directly connected" to another component, it should be understood that the components are directly coupled or connected to each other without still another component interposed therebetween.

"Logic high level" and "logic low level" are used to describe the logic levels of signals. A signal with "logic high level" is distinguished from a signal with "logic low level." For example, when a signal with a first voltage corresponds to a "logic high level," a signal with a second voltage may correspond to a "logic low level." According to an embodiment, a "logic high level" may be set to a voltage higher than a "logic low level." According to an embodiment, the logic levels of signals may be set to different logic levels or opposite logic levels. For example, a signal with a logic high level may be set to have a logic low level according to an embodiment, and a signal with a logic low level may be set to have a logic high level according to an embodiment.

Hereafter, the teachings of the present disclosure will be described in more detail through embodiments. These embodiments are only used to exemplify the teachings of the present disclosure, and the scope of the present disclosure is not limited by the embodiments.

Various embodiments are directed to an electronic device which additionally includes a memory region for storing information regarding the numbers of times each of the logic level combinations of an address is input, and performs a smart refresh operation of refreshing word lines that are adjacent to a most activated word line, according to a result of counting all the logic level combinations of the address.

According to the embodiments of the present disclosure, an electronic device may additionally include a memory region for storing information regarding the numbers of times each of the logic level combinations of an address is input, and may perform a smart refresh operation of refreshing word lines that are adjacent to a most activated word line, according to a result of counting all the logic level combinations of the address.

Also, according to the embodiments of the present disclosure, the electronic device may store the result of counting all the logic level combinations of the address, and, by using the result, may refresh the word lines that are adjacent to the most activated word line, thereby preventing an interference phenomenon between word lines.

As illustrated in FIG. 1, an electronic device 1, in accordance with an embodiment of the present disclosure, may include an active control circuit 11, a target address generation circuit 12, an internal address generation circuit 13, a refresh control circuit 14, a first memory region 21, and a second memory region 22.

The active control circuit 11 may receive an active command ACT and a refresh command REF from an external device (e.g., a controller). The active control circuit 11 may generate an internal read signal IRD, an internal comparison signal ICMP, and an internal write signal IWT based on the active command ACT and the refresh command REF. The active control circuit 11 may generate the internal read signal IRD, the internal comparison signal ICMP, and the internal write signal IWT, which are sequentially generated based on the active command ACT. The active control circuit 11 may generate the internal write signal IWT based on the refresh command REF.

The target address generation circuit 12 may receive the internal read signal IRD, the internal comparison signal ICMP, and the internal write signal IWT from the active control circuit 11. The target address generation circuit 12 may receive first to Nth addresses ADD<1:N> from the external device (e.g., the controller). The target address generation circuit 12 may receive a smart refresh signal SR from the refresh control circuit 14. In an internal read operation, the target address generation circuit 12 may generate first to sixth counting signals TWC<1:6> (see FIG. 4) by up-counting first to sixth read counting signals RCA<1:6> as information regarding the numbers of times the logic level combinations of the first to Nth addresses ADD<1:N> are input. When the internal read signal IRD is input, the target address generation circuit 12 may generate the first to sixth counting signals TWC<1:6> (see FIG. 4) by up-counting the first to sixth read counting signals RCA<1:6> that are input from the first memory region 21. When the first to sixth counting signals TWC<1:6> (see FIG. 4) are counted more than the first to sixth storage counting signals SWC<1:6> (see FIG. 5), the target address generation circuit 12 may store the first to sixth counting signals TWC<1:6> (see FIG. 4) as the first to sixth storage counting signals SWC<1:6> (see FIG. 5). The target address generation circuit 12 may store the first to Nth addresses ADD<1:N>, corresponding to the first to sixth counting signals TWC<1:6> (see FIG. 4), as first to Nth target addresses TAD<1:N> by receiving the smart refresh signal SR. In an internal write operation, the target address generation circuit 12 may output first to sixth write counting signals WCA<1:6>, generated based on the first to sixth counting signals TWC<1:6> (see FIG. 4), to the first memory region 21. The target address generation circuit 12 may, by receiving the internal write signal IWT, output the first to sixth write counting signals WCA<1:6>, generated based on the first to sixth counting signals TWC<1:6> (see FIG. 4), to the first memory region 21. The target address generation circuit 12 may store the first to sixth counting signals TWC<1:6> (see FIG. 4), which are counted the most, as the first to sixth storage counting signals SWC<1:6> (see FIG. 5). In a smart refresh operation, the target address generation circuit 12 may initialize the first to sixth storage counting signals SWC<1:6> (see FIG. 5).

The internal address generation circuit 13 may receive the first to Nth addresses ADD<1:N> from the external device (e.g., the controller). The internal address generation circuit 13 may generate first to Nth internal addresses IADD<1:N> based on the first to Nth addresses ADD<1:N>. The internal address generation circuit 13 may output the first to Nth addresses ADD<1:N> as the first to Nth internal addresses IADD<1:N>. While the internal address generation circuit 13 is implemented to output the first to Nth addresses ADD<1:N> as the first to Nth internal addresses IADD<1:N>, the internal address generation circuit 13 may be implemented to generate the first to Nth internal addresses IADD<1:N> by decoding the first to Nth addresses ADD<1:N>. The number of bits of the first to Nth addresses ADD<1:N> and the number of bits of the first to Nth internal addresses IADD<1:N> may be variously set depending on an embodiment.

The refresh control circuit 14 may receive the refresh command REF from the external device (e.g., the controller). The refresh control circuit 14 may generate the smart refresh signal SR and an internal refresh signal IR based on the refresh command REF. The refresh control circuit 14 may generate the smart refresh signal SR that is enabled when the refresh command REF is repeatedly input a predetermined number of times for performing the smart refresh operation. The refresh control circuit 14 may generate the internal refresh signal IR that is enabled when the refresh command REF is repeatedly input a predetermined number of times for performing a self refresh operation.

Figure 2:
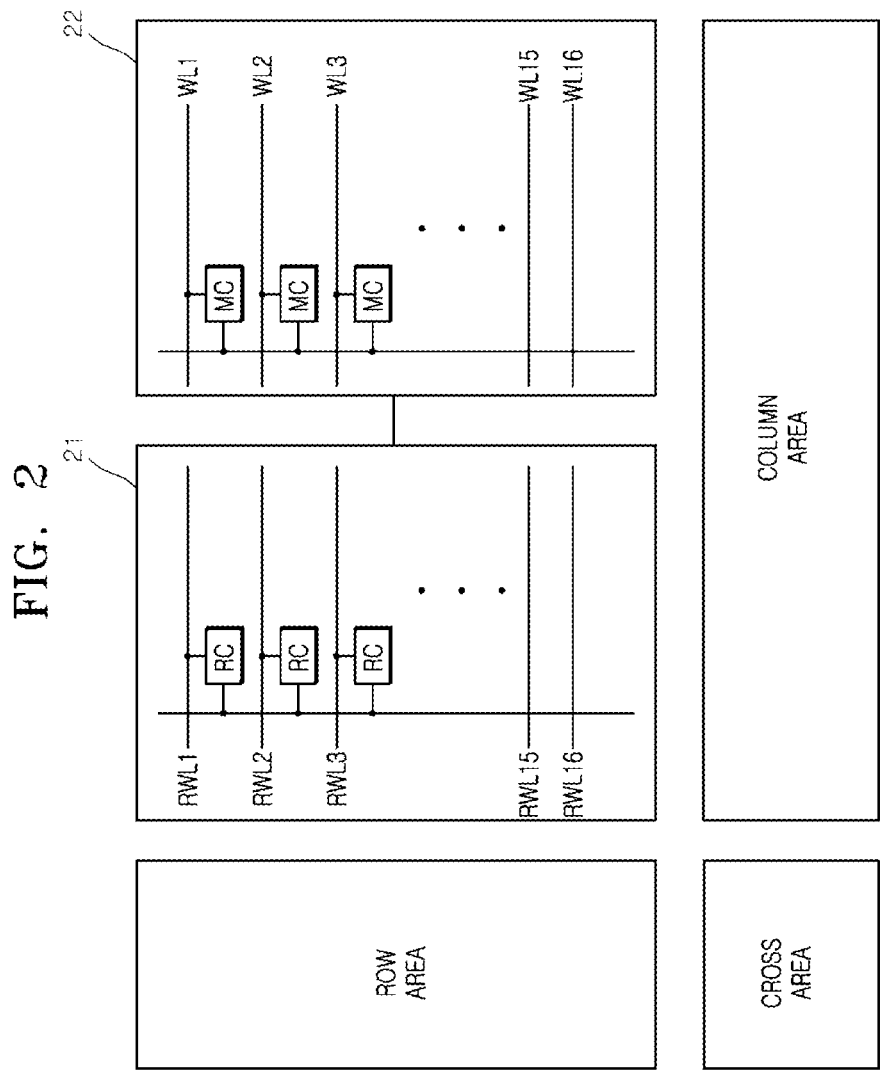
FIG. 2 is a diagram illustrating locations of components included in the electronic device in accordance with the embodiment of the present disclosure.
Figure 9:
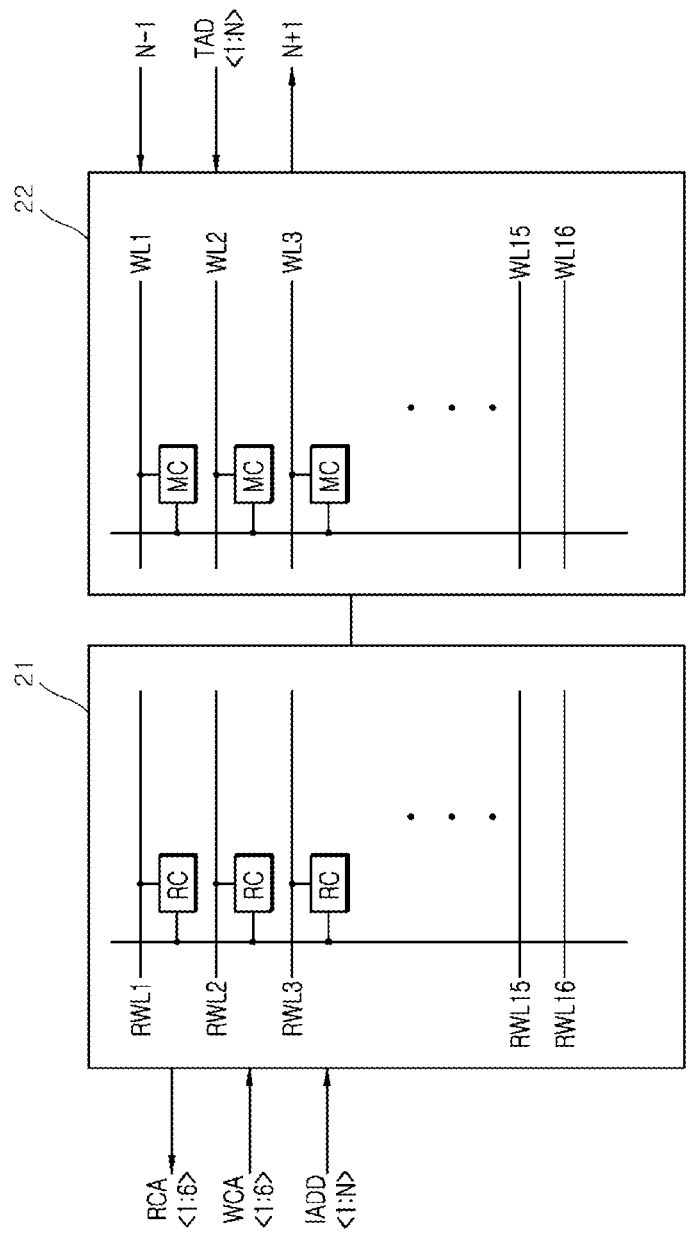
FIG. 9 is a diagram for explaining operations of a first memory region and a second memory region included in the electronic device illustrated in FIG. 1.

The first memory region 21 may include first to sixteenth row hammering word lines RWL1 to RWL16 (see FIGS. 2 and 9). The first memory region 21 may include a plurality of row hammering cells RC (see FIGS. 2 and 9) that are coupled to the first to sixteenth row hammering word lines RWL1 to RWL16 (see FIGS. 2 and 9). In the internal read operation, the first memory region 21 may output, as the first to sixth read counting signals RCA<1:6>, the first to sixth write counting signals WCA<1:6>, stored in row hammering cells RC (see FIGS. 2 and 9), coupled to a row hammering word line, among the first to sixteenth row hammering word lines RWL1 to RWL16 (see FIGS. 2 and 9), selected by the first to Nth internal addresses IADD<1:N>. In the internal write operation, the first memory region 21 may store the first to sixth write counting signals WCA<1:6> in row hammering cells RC (see FIGS. 2 and 9) that are coupled to a row hammering word line, among the first to sixteenth row hammering word lines RWL1 to RWL16 (see FIGS. 2 and 9), selected by the first to Nth internal addresses IADD<1:N>. The first memory region 21 may initialize the first to sixth write counting signals WCA<1:6> stored therein, by receiving an initialization signal INIT that is input during a power-up period and a boot-up operation for the electronic device 1 to start an operation. All bits of the first to sixth write counting signals WCA<1:6> that are initialized may be generated at logic low levels. While the first memory region 21 is implemented to include the first to sixteenth row hammering word lines RWL1 to RWL16 (see FIGS. 2 and 9), the first memory region 21 may be implemented to include various numbers of row hammering word lines depending on an embodiment. The first memory region 21 may store the first to sixth write counting signals WCA<1:6>, as information regarding the number of times the logic level combinations of the first to Nth addresses ADD<1:N> are input for activating first to sixteenth word lines WL1 to WL16 (see FIGS. 2 and 9), included in the second memory region 22, in the row hammering cells RC (see FIGS. 2 and 9), coupled to the first to sixteenth row hammering word lines RWL1 to RWL16 (see FIGS. 2 and 9).

The second memory region 22 may include the first to sixteenth word lines WL1 to WL16 (see FIGS. 2 and 9). The second memory region 22 may include a plurality of memory cells MC (see FIGS. 2 and 9) that are coupled to the first to sixteenth word lines WL1 to WL16 (see FIGS. 2 and 9). In a read operation, the second memory region 22 may receive a read signal RD and thereby output data DATA that is stored in memory cells MC (see FIGS. 2 and 9) that are coupled to a word line, among the first to sixteenth word lines WL1 to WL16 (see FIGS. 2 and 9), selected by the first to Nth internal addresses IADD<1:N>. In a write operation, the second memory region 22 may receive a write signal WT and thereby store data DATA in memory cells MC (see FIGS. 2 and 9) that are coupled to a word line, among the first to sixteenth word lines WL1 to WL16 (see FIGS. 2 and 9), selected by the first to Nth internal addresses IADD<1:N>. In the self refresh operation, the second memory region 22 may receive the internal refresh signal IR and thereby perform a refresh operation on the first to sixteenth word lines WL1 to WL16 (see FIGS. 2 and 9). In the smart refresh operation, the second memory region 22 may refresh word lines that are adjacent to a word line that is selected by the first to Nth target addresses TAD<1:N>. The read signal RD and the write signal WT may be set as signals that are internally generated by commands that are input from the external device (e.g., the controller) in the read operation and the write operation during a general active operation. While the second memory region 22 is implemented to include the first to sixteenth word lines WL1 to WL16 (see FIGS. 2 and 9), the second memory region 22 may be implemented to include various numbers of word lines depending on an embodiment.

Among the first to sixteenth row hammering word lines RWL1 to RWL16 (see FIGS. 2 and 9) that are included in the first memory region 21 and the first to sixteenth word lines WL1 to WL16 (see FIGS. 2 and 9) that are included in the second memory region 22, word lines of the same order may be simultaneously activated by the first to Nth internal addresses IADD<1:N>. For example, when the first row hammering word line RWL1 (see FIGS. 2 and 9) that are included in the first memory region 21 is activated by the first to Nth internal addresses IADD<1:N>, the first word line WL1 (see FIGS. 2 and 9) that are included in the second memory region 22 may be activated. While the first to sixteenth row hammering word lines RWL1 to RWL16 (see FIGS. 2 and 9) that are included in the first memory region 21 and the first to sixteenth word lines WL1 to WL16 (see FIGS. 2 and 9) that are included in the second memory region 22 are implemented by different word lines, this is merely an example, and the first to sixteenth row hammering word lines RWL1 to RWL16 and the first to sixteenth word lines WL1 to WL16 may be implemented by the same word lines.

The locations of the components of the electronic device 1, in accordance with the embodiment of the present disclosure, will be described below with reference to FIG. 2.

A row area ROW AREA for controlling the first memory region 21 and the second memory region 22 may be located on the left side of the first memory region 21 and the second memory region 22. A column area COLUMN AREA for controlling the first memory region 21 and the second memory region 22 may be located on the lower side of the first memory region 21 and the second memory region 22. A cross area CROSS AREA may be located at which the lower side of the row area ROW AREA and the left side of the column area COLUMN AREA intersect with each other. According to an embodiment, the row area ROW AREA may be implemented to be located on the right side of the first memory region 21 and the second memory region 22, and the column area COLUMN AREA may be implemented to be located on the upper side of the first memory region 21 and the second memory region 22.

The active control circuit 11, the target address generation circuit 12, the internal address generation circuit 13, and the refresh control circuit 14 may be located in a row area 10 (ROW AREA) for controlling a memory region 20 with the first memory region 21 and the second memory region 22, or may be located in both the row area 10 (ROW AREA) and the cross area CROSS AREA. The row area ROW AREA, the column area COLUMN AREA, and the cross area CROSS AREA, illustrated in FIG. 2, may be implemented to include control circuits for inputting/outputting the data DATA by activating a plurality of word lines that are included in the second memory region 22.

Figure 3:
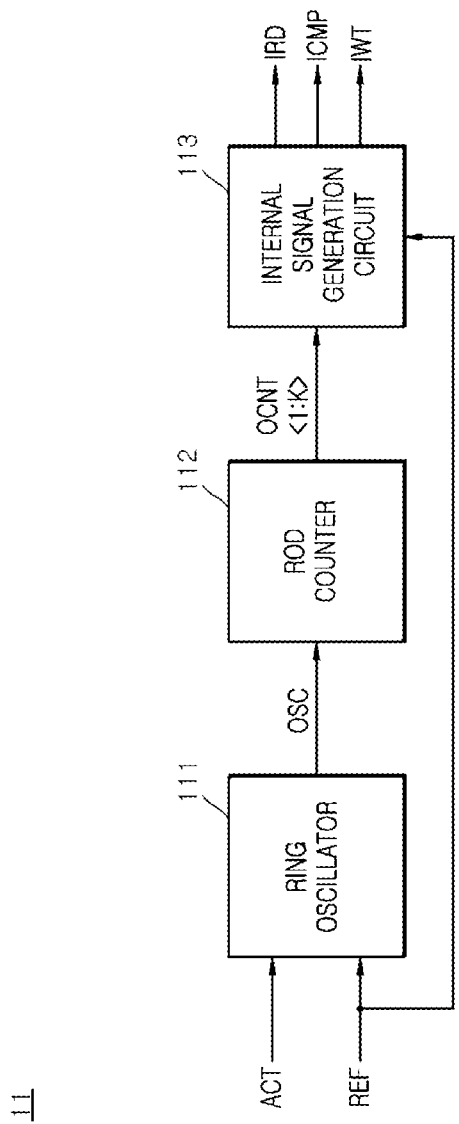
FIG. 3 is a block diagram illustrating a configuration of an active control circuit included in the electronic device illustrated in FIG. 1.

FIG. 3 is a block diagram illustrating an embodiment of the active control circuit 11. As illustrated in FIG. 3, the active control circuit 11 may include a ring oscillator 111, an ROD counter 112, and an internal signal generation circuit 113.

The ring oscillator 111 may generate a cycle signal OSC that toggles based on the active command ACT and the refresh command REF. The ring oscillator 111 may generate the cycle signal OSC that cyclically toggles when the active command ACT is input. The ring oscillator 111 may generate the cycle signal OSC that cyclically toggles when the refresh command REF is input.

The ROD counter 112 may generate first to Kth oscillation counting signals OCNT<1:K> that are counted based on the cycle signal OSC. The ROD counter 112 may generate the first to Kth oscillation counting signals OCNT<1:K> that are counted each time the pulse of the cycle signal OSC is input. The number K of bits of the first to Kth oscillation counting signals OCNT<1:K> may be set to various numbers depending on an embodiment.

The internal signal generation circuit 113 may generate the internal read signal IRD, the internal comparison signal ICMP, and the internal write signal IWT that are sequentially enabled based on the refresh signal REF and the first to Kth oscillation counting signals OCNT<1:K>. The internal signal generation circuit 113 may generate the internal read signal IRD when the first to Kth oscillation counting signals OCNT<1:K> are counted as a first logic level combination. The internal signal generation circuit 113 may generate the internal comparison signal ICMP when the first to Kth oscillation counting signals OCNT<1:K> are counted as a second logic level combination. The internal signal generation circuit 113 may generate the internal write signal IWT when the first to Kth oscillation counting signals OCNT<1:K> are counted as a third logic level combination. The internal signal generation circuit 113 may generate the internal write signal IWT when the refresh command REF is input, and the first to Kth oscillation counting signals OCNT<1:K> may be counted as the third logic level combination. The case in which the first to Kth oscillation counting signals OCNT<1:K> are counted as the second logic level combination may refer to a case in which the first to Kth oscillation counting signals OCNT<1:K> are counted more than the case in which the first to Kth oscillation counting signals OCNT<1:K> are counted as the first logic level combination. The case in which the first to Kth oscillation counting signals OCNT<1:K> are counted as the third logic level combination may refer to a case in which the first to Kth oscillation counting signals OCNT<1:K> are counted more than the case in which the first to Kth oscillation counting signals OCNT<1:K> are counted as the second logic level combination.

Figure 4:
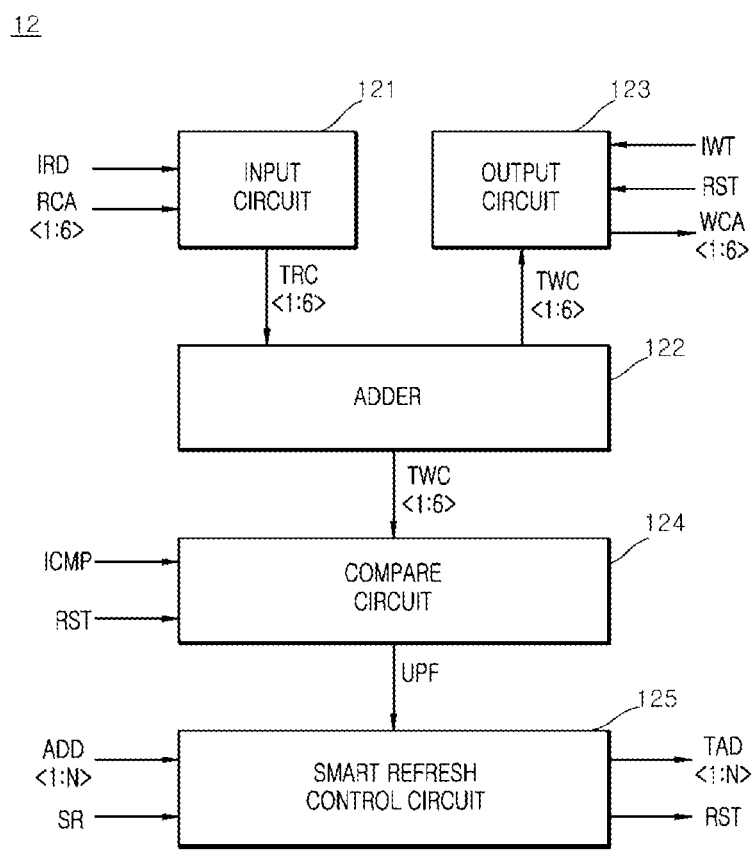
FIG. 4 is a block diagram illustrating a configuration of a target address generation circuit included in the electronic device illustrated in FIG. 1.

FIG. 4 is a block diagram illustrating an embodiment of the target address generation circuit 12. As illustrated in FIG. 4, the target address generation circuit 12 may include an input circuit 121, an adder 122, an output circuit 123, a compare circuit 124 and a smart refresh control circuit 125.

When the internal read signal IRD is input, the input circuit 121 may generate first to sixth transfer read counting signals TRC<1:6> based on the first to sixth read counting signals RCA<1:6> received from the first memory region 21. When the internal read signal IRD is input, the input circuit 121 may generate the first to sixth transfer read counting signals TRC<1:6> by buffering the first to sixth read counting signals RCA<1:6>. Although the first to sixth read counting signals RCA<1:6> and the first to sixth transfer read counting signals TRC<1:6> are implemented by six bits, this is merely an example, and the first to sixth read counting signals RCA<1:6> and the first to sixth transfer read counting signals TRC<1:6> may be implemented by various numbers of bits depending on an embodiment.

The adder 122 may up-count the first to sixth transfer read counting signals TRC<1:6>. The adder 122 may generate the first to sixth counting signals TWC<1:6> by up-counting the first to sixth transfer read counting signals TRC<1:6>. Although the first to sixth counting signals TWC<1:6> are implemented by six bits, this is merely an example, and the first to sixth counting signals TWC<1:6> may be implemented by various numbers of bits depending on an embodiment.

In the internal write operation, the output circuit 123 may generate the first to sixth write counting signals WCA<1:6> based on the first to sixth counting signals TWC<1:6>. When the internal write signal IWT is input, the output circuit 123 may generate the first to sixth write counting signals WCA<1:6> based on the first to sixth counting signals TWC<1:6>. When the internal write signal IWT is input, the output circuit 123 may output the first to sixth write counting signals WCA<1:6> to the first memory region 21. After the smart refresh operation is performed, the output circuit 123 may initialize all bits of the first to sixth write counting signals WCA<1:6> to logic low levels. When a reset signal RST is input after the smart refresh operation is performed, the output circuit 123 may initialize all bits of the first to sixth write counting signals WCA<1:6> to logic low levels. When the internal write signal IWT is input after the smart refresh operation is performed, the output circuit 123 may output the first to sixth write counting signals WCA<1:6> of which all bits are initialized to logic low levels by the reset signal RST, to the first memory region 21. Although the first to sixth write counting signals WCA<1:6> are implemented by six bits, this is merely an example, and the first to sixth write counting signals WCA<1:6> may be implemented by various numbers of bits depending on an embodiment.

When the internal comparison signal ICMP is input, the compare circuit 124 may generate a flag signal UPF by comparing the first to sixth counting signals TWC<1:6> and the first to sixth storage counting signals SWC<1:6> (see FIG. 5) that are stored therein. When the internal comparison signal ICMP is input, the compare circuit 124 may generate the flag signal UPF that is enabled in the case in which the first to sixth counting signals TWC<1:6> are counted more than the first to sixth storage counting signals SWC<1:6> (see FIG. 5) that are stored therein. When the internal comparison signal ICMP is input, the compare circuit 124 may generate the flag signal UPF that is disabled in the case in which the first to sixth counting signals TWC<1:6> are counted less than or equal to the first to sixth storage counting signals SWC<1:6> (see FIG. 5) that are stored therein. When the internal comparison signal ICMP is input, the compare circuit 124 may store the first to sixth counting signals TWC<1:6> as the first to sixth storage counting signals SWC<1:6> (see FIG. 5) in the case which the first to sixth counting signals TWC<1:6> are counted more than the first to sixth storage counting signals SWC<1:6> (see FIG. 5) that are stored therein. When the reset signal RST is input after the smart refresh operation is performed, the compare circuit 124 may initialize all bits of the first to sixth storage counting signals SWC<1:6> (see FIG. 5) to logic low levels.

When the flag signal UPF is input, the smart refresh control circuit 125 may store the first to Nth addresses ADD<1:N> as the first to Nth target addresses TAD<1:N>. When the smart refresh signal SR is input, the smart refresh control circuit 125 may output the stored first to Nth target addresses TAD<1:N> to the second memory region 22. The smart refresh control circuit 125 may generate the reset signal RST that is enabled when the first to Nth target addresses TAD<1:N> are output.

Figure 5:
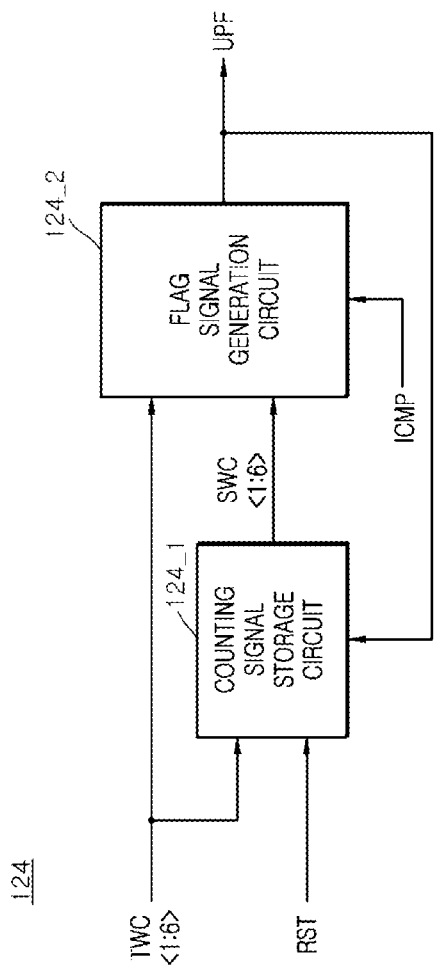
FIG. 5 is a block diagram illustrating a configuration of a compare circuit included in the target address generation circuit illustrated in FIG. 4.

FIG. 5 is a block diagram illustrating an embodiment of the compare circuit 124. As illustrated in FIG. 5, the compare circuit 124 may include a counting signal storage circuit 124_1 and a flag signal generation circuit 124_2.

When the flag signal UPF is input, the counting signal storage circuit 124_1 may store the first to sixth counting signals TWC<1:6> as the first to sixth storage counting signals SWC<1:6>. The counting signal storage circuit 124_1 may output the stored first to sixth counting signals TWC<1:6> as the first to sixth storage counting signals SWC<1:6>. When the reset signal RST is input, the counting signal storage circuit 124_1 may initialize the first to sixth storage counting signals SWC<1:6>. When the reset signal RST is input, the counting signal storage circuit 124_1 may initialize all bits of the first to sixth storage counting signals SWC<1:6> to logic low levels.

The flag signal generation circuit 124_2 may generate the flag signal UPF by comparing the first to sixth counting signals TWC<1:6> and the first to sixth storage counting signals SWC<1:6>. The flag signal generation circuit 124_2 may generate the flag signal UPF that is enabled when the first to sixth counting signals TWC<1:6> are counted more than the first to sixth storage counting signals SWC<1:6>.

Figure 6:
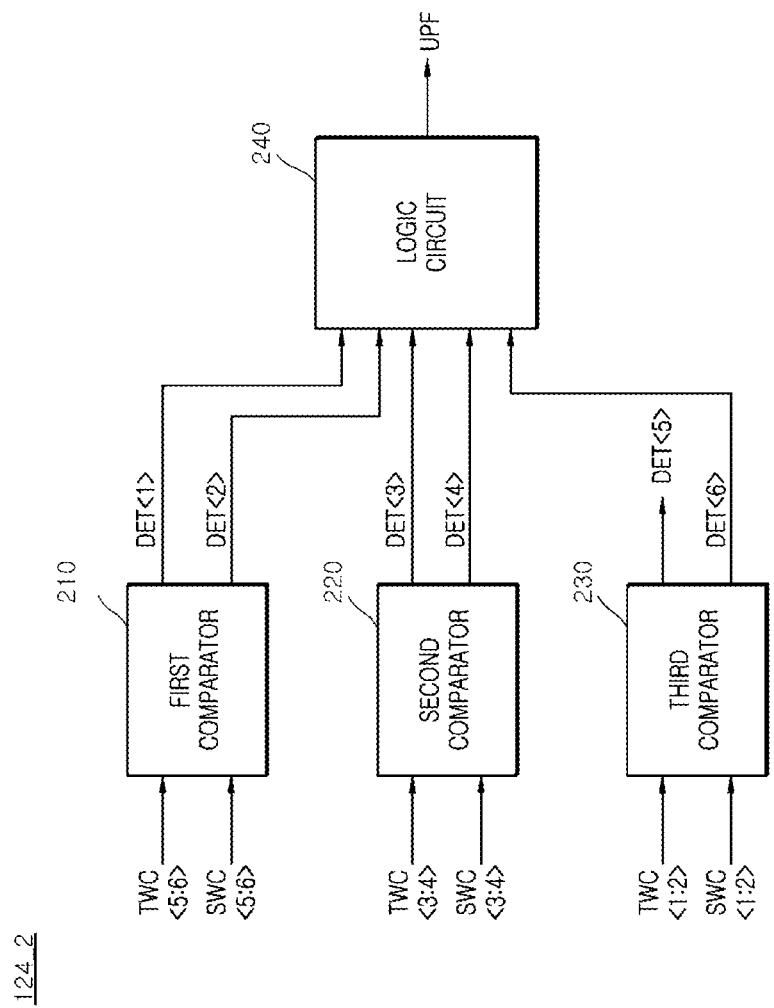
FIG. 6 is a block diagram illustrating a configuration of a flag signal generation circuit included in the compare circuit illustrated in FIG. 5.

FIG. 6 is a block diagram illustrating an embodiment of the flag signal generation circuit 124_2. As illustrated in FIG. 6, the flag signal generation circuit 124_2 may include a first comparator 210, a second comparator 220, a third comparator 230, and a logic circuit 240.

The first comparator 210 may compare the fifth and sixth counting signals TWC<5:6> and the fifth and sixth storage counting signals SWC<5:6> and thereby generate a first detection signal DET<1> and a second detection signal DET<2>. The first comparator 210 may generate the first detection signal DET<1> that is enabled when the fifth and sixth counting signals TWC<5:6> and the fifth and sixth storage counting signals SWC<5:6> are the same logic level combination. The first comparator 210 may generate the second detection signal DET<2> that is enabled when the fifth and sixth counting signals TWC<5:6> and the fifth and sixth storage counting signals SWC<5:6> are different logic level combinations. Although the first comparator 210 is implemented to compare the fifth and sixth counting signals TWC<5:6> of two bits and the fifth and sixth storage counting signals SWC<5:6> of two bits, this is merely an example, and the first comparator 210 may be implemented to compare various numbers of bits depending on an embodiment.

The second comparator 220 may compare the third and fourth counting signals TWC<3:4> and the third and fourth storage counting signals SWC<3:4> and thereby generate a third detection signal DET<3> and a fourth detection signal DET<4>. The second comparator 220 may generate the third detection signal DET<3> that is enabled when the third and fourth counting signals TWC<3:4> and the third and fourth storage counting signals SWC<3:4> are the same logic level combination. The second comparator 220 may generate the fourth detection signal DET<4> that is enabled when the third and fourth counting signals TWC<3:4> and the third and fourth storage counting signals SWC<3:4> are different logic level combinations. Although the second comparator 220 is implemented to compare the third and fourth counting signals TWC<3:4> of two bits and the third and fourth storage counting signals SWC<3:4> of two bits, this is merely an example, and the second comparator 220 may be implemented to compare various numbers of bits depending on an embodiment.

The third comparator 230 may compare the first and second counting signals TWC<1:2> and the first and second storage counting signals SWC<1:2> and thereby generate a fifth detection signal DET<5> and a sixth detection signal DET<6>. The third comparator 230 may generate the fifth detection signal DET<5> that is enabled when the first and second counting signals TWC<1:2> and the first and second storage counting signals SWC<1:2> are the same logic level combination. The third comparator 230 may generate the sixth detection signal DET<6> that is enabled when the first and second counting signals TWC<1:2> and the first and second storage counting signals SWC<1:2> are different logic level combinations. Although the third comparator 230 is implemented to compare the first and second counting signals TWC<1:2> of two bits and the first and second storage counting signals SWC<1:2> of two bits, this is merely an example, and the third comparator 230 may be implemented to compare various numbers of bits depending on an embodiment.

The logic circuit 240 may generate the flag signal UPF based on the first detection signal DET<1>, the second detection signal DET<2>, the third detection signal DET<3>, the fourth detection signal DET<4>, and the sixth detection signal DET<6>. The logic circuit 240 may generate the flag signal UPF based on the logic levels of the first detection signal DET<1>, the second detection signal DET<2>, the third detection signal DET<3>, the fourth detection signal DET<4>, and the sixth detection signal DET<6>. The logic circuit 240 may generate the flag signal UPF that is disabled when both the first detection signal DET<1> and the third detection signal DET<3> are enabled and the sixth detection signal DET<6> is disabled. The logic circuit 240 may generate the flag signal UPF that is enabled when any one of the second detection signal DET<2>, the fourth detection signal DET<4>, and the sixth detection signal DET<6> is enabled.

Figure 7:
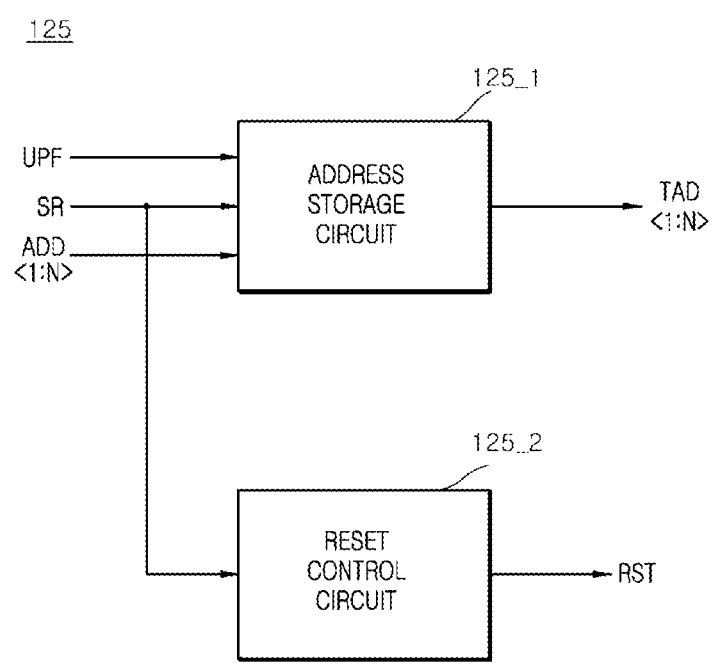
FIG. 7 is a block diagram illustrating a configuration of a smart refresh control circuit included in the target address generation circuit illustrated in FIG. 4.

FIG. 7 is a block diagram illustrating an embodiment of the smart refresh control circuit 125. As illustrated in FIG. 7, the smart refresh control circuit 125 may include an address storage circuit 125_1 and a reset control circuit 125_2.

The address storage circuit 125_1 may generate the first to Nth target addresses TAD<1:N> based on the first to Nth addresses ADD<1:N> based on the flag signal UPF and the smart refresh signal SR. When the flag signal UPF is input at a logic high level, the address storage circuit 125_1 may store the first to Nth addresses ADD<1:N> as the first to Nth target addresses TAD<1:N>. When the smart refresh signal SR is input at a logic high level, the address storage circuit 125_1 may output the stored first to Nth target addresses TAD<1:N>.

The reset control circuit 125_2 may generate the reset signal RST based on the smart refresh signal SR. The reset control circuit 125_2 may generate the reset signal RST that is enabled when the smart refresh operation is completed after the smart refresh signal SR is input. The reset control circuit 125_2 may generate the reset signal RST that is enabled by delaying the smart refresh signal SR until the smart refresh operation is completed.

Figure 8:
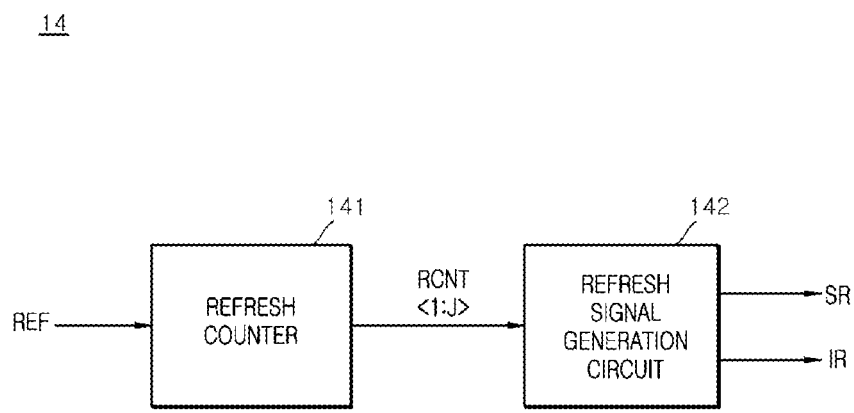
FIG. 8 is a block diagram illustrating a configuration of a refresh control circuit included in the electronic device illustrated in FIG. 1.

FIG. 8 is a block diagram illustrating an embodiment of the refresh control circuit 14. As illustrated in FIG. 8, the refresh control circuit 14 may include a refresh counter 141 and a refresh signal generation circuit 142.

The refresh counter 141 may generate first to Jth refresh counting signals RCNT<1:J> based on the refresh command REF. The refresh counter 141 may generate the first to Jth refresh counting signals RCNT<1:J> that are up-counted each time the refresh command REF is input. The number J of bits of the first to Jth refresh counting signals RCNT<1:J> may be set to various numbers depending on an embodiment.

The refresh signal generation circuit 142 may generate the smart refresh signal SR and the internal refresh signal IR based on the first to Jth refresh counting signals RCNT<1:J>. The refresh signal generation circuit 142 may generate the smart refresh signal SR when the first to Jth refresh counting signals RCNT<1:J> are counted as a fourth logic level combination. The refresh signal generation circuit 142 may generate the smart refresh signal SR with pulses that are sequentially generated when the first to Jth refresh counting signals RCNT<1:J> are counted as the fourth logic level combination. The fourth logic level combination of the first to Jth refresh counting signals RCNT<1:J> may be set as the number of times the refresh command REF is input to perform the smart refresh operation. The refresh signal generation circuit 142 may generate the internal refresh signal IR when the first to Jth refresh counting signals RCNT<1:J> are counted as a fifth logic level combination. The fifth logic level combination of the first to Jth refresh counting signals RCNT<1:J> may be set as the number of times the refresh command REF is input to perform the self refresh operation.

The operations of the first memory region 21 and the second memory region 22 for performing the smart refresh operation will be described below with reference to FIG. 9 for a case in which the first to Nth internal addresses IADD<1:N> are a logic level combination for selecting the second word line WL2.

In the first memory region 21, in the internal read operation, the second row hammering word line RWL2 may be activated by the first to Nth internal addresses IADD<1:N> for selecting the second word line WL2. The first memory region 21 may output the first to sixth write counting signals WCA<1:6>, stored in the row hammering cells RC, coupled to the second row hammering word line RWL2, as the first to sixth read counting signals RCA<1:6>.

In the second memory region 22, as the first word line WL1 (N−1) and the third word line WL3 (N+1) are activated by the first to Nth target addresses TAD<1:N> for selecting the second word line WL2, the smart refresh operation may be performed.

In the first memory region 21, in the internal write operation, the second row hammering word line RWL2 may be activated by the first to Nth internal addresses IADD<1:N> for selecting the second word line WL2. The first memory region 21 may store the first to sixth write counting signals WCA<1:6> that are stored in the row hammering cells RC coupled to the second row hammering word line RWL2. At this time, since it is after the smart refresh operation is performed, all bits of the first to sixth write counting signals WCA<1:6> may be initialized to logic low levels.

That is to say, the first memory region 21 may store information regarding the number of times the logic level combinations of the first to Nth addresses ADD<1:N> are input and may provide the first to sixth read counting signals RCA<1:6>, obtained by counting all the logic level combinations of the first to Nth addresses ADD<1:N>, to the target address generation circuit 12. The second memory region 22 may perform the smart refresh operation by the first to Nth target addresses TAD<1:N> as information regarding a word line, among the first to sixteenth word lines WL1 to WL16, most activated by the first to Nth addresses ADD<1:N>.

Figure 10:
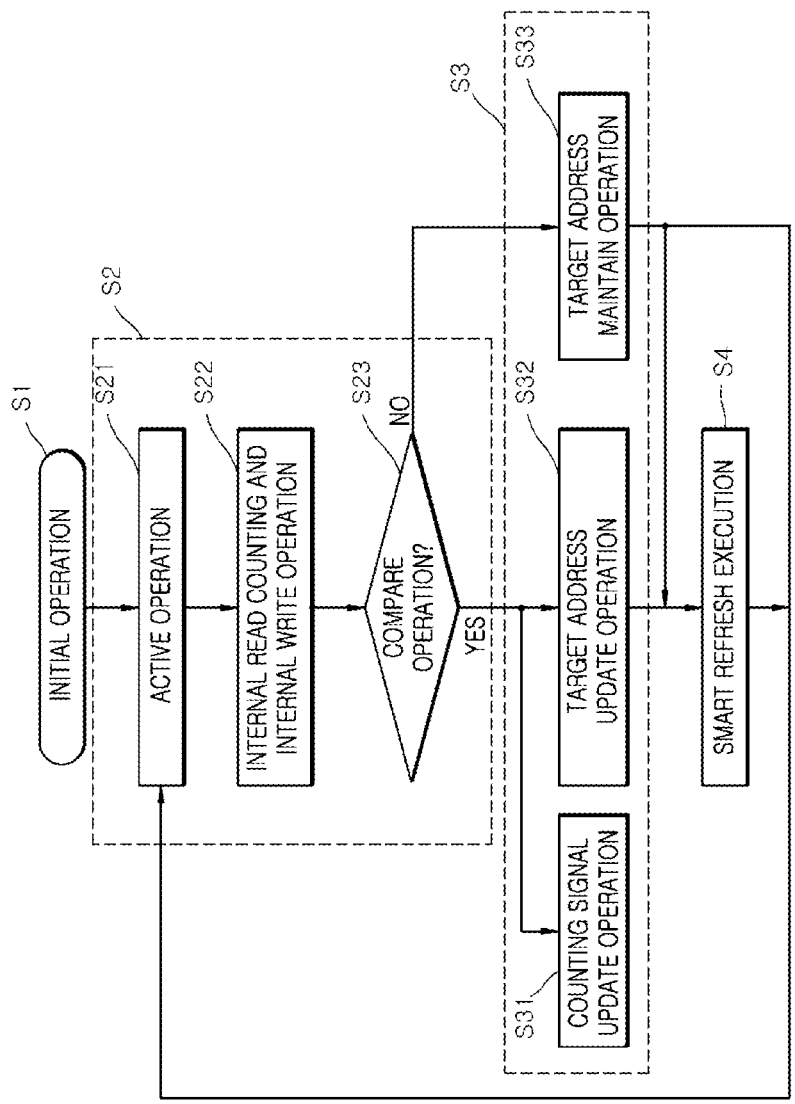
FIG. 10 is a flowchart for explaining a smart refresh operation of the electronic device in accordance with the embodiment of the present disclosure.

The smart refresh operation of the electronic device 1, in accordance with the embodiment of the present disclosure, will be described below with reference to FIG. 10.

The smart refresh operation may include initialization operation step S1, active detection step S2, target address generation step S3 and smart refresh execution step S4.

The initialization operation step S1 may be set as a power-up period and a boot-up operation for the electronic device 1 to start an operation. At the initialization operation step S1, the first memory region 21 may receive the initialization signal INIT and thereby initialize the first to sixth write counting signals WCA<1:6> that are stored therein. The first to sixth write counting signals WCA<1:6> that are stored therein may refer to the first to sixth write counting signals WCA<1:6> that are stored in the first to sixteenth row hammering word lines RWL1 to RWL16, respectively. All bits of the first to sixth write counting signals WCA<1:6> may be initialized to logic low levels.

The active detection step S2 may include active operation step S21, internal read, counting, and internal write operation step S22, and compare operation step S23.

The active operation step S21 may be set as a step of receiving the active command ACT, the refresh command REF, and the first to Nth addresses ADD<1:N> from the external device (e.g., the controller).

The internal read, counting, and internal write operation step S22 may be set as a step of generating the internal read signal IRD, the internal comparison signal ICMP, and the internal write signal IWT based on the active command ACT. At the internal read, counting, and internal write operation step S22, the active control circuit 11 may generate the internal read signal IRD, the internal comparison signal ICMP and the internal write signal IWT based on the active command ACT. When the internal read signal IRD is generated at the internal read, counting, and internal write operation step S22, the target address generation circuit 12 may generate the first to sixth counting signals TWC<1:6> by up-counting the first to sixth read counting signals RCA<1:6> which are input from the first memory region 21. At the internal read, counting, and internal write operation step S22, after generating the internal read signal IRD, the active control circuit 11 may generate the internal comparison signal ICMP and the internal write signal IWT. When the internal write signal IWT is generated at the internal read, counting, and internal write operation step S22, the target address generation circuit 12 may generate the first to sixth write counting signals WCA<1:6> based on the first to sixth counting signals TWC<1:6> and may output the first to sixth write counting signals WCA<1:6> to the first memory region 21. At the internal read, counting, and internal write operation step S22, the first memory region 21 may store the first to sixth write counting signals WCA<1:6>.

The compare operation step S23 may be set as an operation of comparing the first to sixth counting signals TWC<1:6> and the first to sixth storage counting signals SWC<1:6>. At the compare operation step S23, the target address generation circuit 12 may compare the first to sixth counting signals TWC<1:6> and the first to sixth storage counting signals SWC<1:6> when the internal comparison signal ICMP is input. At the compare operation step S23, the target signal generation circuit 12 may generate the flag signal UPF that is enabled when the first to sixth counting signals TWC<1:6> are counted more than the first to sixth storage counting signals SWC<1:6> (YES). At the compare operation step S23, the target signal generation circuit 12 may generate the flag signal UPF that is disabled when the first to sixth counting signals TWC<1:6> are counted less than or equal to the first to sixth storage counting signals SWC<1:6> (NO).

The target address generation step S3 may include counting signal update operation step S31, target address update operation step S32, and target address maintain operation step S33.

The counting signal update operation step S31 may be performed when, at the compare operation step S23, the first to sixth counting signals TWC<1:6> are counted more than the first to sixth storage counting signals SWC<1:6> (YES). At the counting signal update operation step S31, the target address generation circuit 12 may store the first to sixth counting signals TWC<1:6> as the first to sixth storage counting signals SWC<1:6> by the flag signal UPF that is enabled.

The target address update operation step S32 may be performed when, at the compare operation step S23, the first to sixth counting signals TWC<1:6> are counted more than the first to sixth storage counting signals SWC<1:6> (YES). At the target address update operation step S32, the target address generation circuit 12 may store the first to Nth addresses ADD<1:N> as the first to Nth target addresses TAD<1:N> by the flag signal UPF that is enabled.

The target address maintain operation step S33 may be performed when, at the compare operation step S23, the first to sixth counting signals TWC<1:6> are counted less than or equal to the first to sixth storage counting signals SWC<1:6> (NO). At the target address maintain operation step S33, the target address generation circuit 12 does not store the first to Nth addresses ADD<1:N> as the first to Nth target addresses TAD<1:N> by the flag signal UPF that is disabled. In other words, the first to Nth target addresses TAD<1:N> maintain information regarding a most activated word line. When the target address maintain operation step S33 ends, the process may reenter the active operation step S21.

The smart refresh execution step S4 may be set as a step of performing the smart refresh operation by the refresh command REF. At the smart refresh execution step S4, when the smart refresh signal SR is input, the target address generation circuit 12 may output the stored first to Nth target addresses TAD<1:N> to the second memory region 22. At the smart refresh execution step S4, the second memory region 22 may perform the smart refresh operation by activating word lines N−1 and N+1 that are adjacent to a word line that is selected by the first to Nth target addresses TAD<1:N>. At the smart refresh execution step S4, the row hammering cells RC that are included in the first memory region 21 may be initialized. When the smart refresh execution step S4 ends, the process may reenter the active operation step S21.

Figure 11:
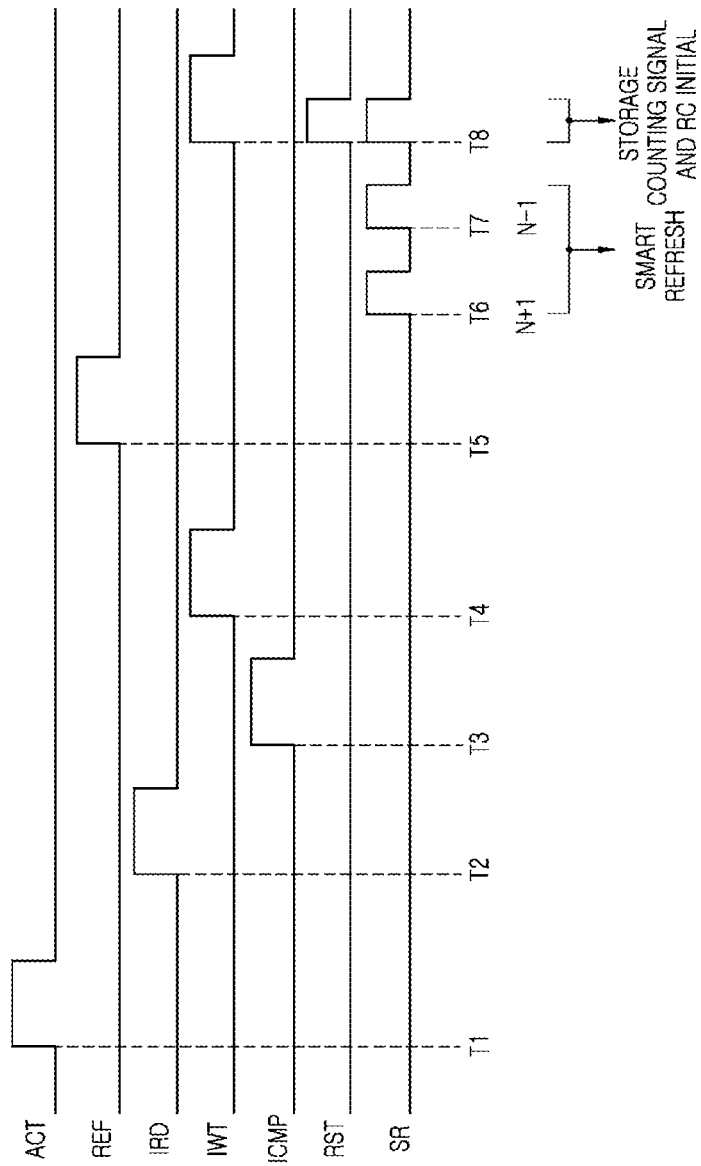
FIG. 11 is a timing diagram for explaining the smart refresh operation of the electronic device in accordance with the embodiment of the present disclosure.

The smart refresh operation of the electronic device 1 in accordance with the embodiment of the present disclosure will be described below with reference to FIG. 11.

At a time point T1, the active command ACT may be input from the external device (e.g., the controller).

At a time point T2, the active control circuit 11 may generate the internal read signal IRD based on the active command ACT. The target address generation circuit 12 may receive the internal read signal IRD and thereby generate the first to sixth counting signals TWC<1:6> by up-counting the first to sixth read counting signals RCA<1:6> that are input from the first memory region 21.

At a time point T3, the active control circuit 11 may generate the internal comparison signal ICMP based on the active command ACT. When the internal comparison signal ICMP is input, the target address generation circuit 12 may generate the flag signal UPF by comparing the first to sixth counting signals TWC<1:6> and the first to sixth storage counting signals SWC<1:6>. When the flag signal UPF is enabled, the target address generation circuit 12 may store the first to Nth addresses ADD<1:N> as the first to Nth target addresses TAD<1:N>. When the flag signal UPF is enabled, the target address generation circuit 12 may store the first to sixth counting signals TWC<1:6> as the first to sixth storage counting signals SWC<1:6>. The first to sixth storage counting signals SWC<1:6> may be generated based on the first to sixth counting signals TWC<1:6> that are counted the most. When the flag signal UPF is disabled, the target address generation circuit 12 might not store the first to Nth addresses ADD<1:N> as the first to Nth target addresses TAD<1:N>. When the flag signal UPF is disabled, the target address generation circuit 12 might not store the first to sixth counting signals TWC<1:6> as the first to sixth storage counting signals SWC<1:6>.

At a time point T4, the active control circuit 11 may generate the internal write signal IWT based on the active command ACT. The target address generation circuit 12 may receive the internal write signal IWT and thereby output the first to sixth write counting signals WCA<1:6>, generated based on the first to sixth counting signals TWC<1:6>, to the first memory region 21. The first memory region 21 may store the first to sixth write counting signals WCA<1:6> in row hammering cells RC that are coupled to a row hammering word line that is activated by the first to Nth internal addresses IADD<1:N> among the first to sixteenth row hammering word lines RWL1 to RWL16.

At a time point T5, the refresh command REF may be input from the external device (e.g., the controller). This means that the refresh command REF is repeatedly input to perform the smart refresh operation.

At a time point T6, the refresh control circuit 14 may generate a first pulse of the smart refresh signal SR based on the refresh command REF. The target address generation circuit 12 may output the first to Nth target addresses TAD<1:N> to the second memory region 22 by the first pulse of the smart refresh signal SR. The second memory region 22 may perform the smart refresh operation by activating a word line N+1 that is adjacent to a word line that is selected by the first to Nth target addresses TAD<1:N> among the first to sixteenth word lines WL1 to WL16 (SMART REFRESH). Meanwhile, the second memory region 22 may perform the smart refresh operation by activating a word line N+2 that is adjacent to a word line that is selected by the first to Nth target addresses TAD<1:N> among the first to sixteenth word lines WL1 to WL16 (SMART REFRESH).

At a time point T7, the refresh control circuit 14 may generate a second pulse of the smart refresh signal SR based on the refresh command REF. The target address generation circuit 12 may output the first to Nth target addresses TAD<1:N> to the second memory region 22 by the second pulse of the smart refresh signal SR. The second memory region 22 may perform the smart refresh operation by activating a word line N−1 that is adjacent to a word line that is selected by the first to Nth target addresses TAD<1:N> among the first to sixteenth word lines WL1 to WL16 (SMART REFRESH). Meanwhile, the second memory region 22 may perform the smart refresh operation by activating a word line N−2 that is adjacent to a word line that is selected by the first to Nth target addresses TAD<1:N> among the first to sixteenth word lines WL1 to WL16 (SMART REFRESH).

At a time point T8, the refresh control circuit 14 may generate a third pulse of the smart refresh signal SR based on the refresh command REF.

The reset control circuit 125_2 may generate the reset signal RST that is enabled when the smart refresh operation is completed after the smart refresh signal SR is input.

When the reset signal RST is input, the counting signal storage circuit 124_1 may initialize all bits of the first to sixth storage counting signals SWC<1:6> to logic low levels. Namely, the first to sixth storage counting signals SWC<1:6> may be initialized (STORAGE COUNTING SIGNAL INITIAL).

The active control circuit 11 may generate the internal write signal IWT based on the refresh command REF. The target address generation circuit 12 may receive the internal write signal IWT and thereby output the first to sixth write counting signals WCA<1:6> of which all bits are initialized to logic low levels, to the first memory region 21. The first memory region 21 may store the initialized first to sixth write counting signals WCA<1:6> in row hammering cells RC that are coupled to a row hammering word line, among the first to sixteenth row hammering word lines RWL1 to RWL16, activated by the first to Nth internal addresses IADD<1:N>. Namely, the row hammering cells RC of the first memory region 21 may be initialized (RC INITIAL).

As is apparent from the above description, the electronic device 1, in accordance with the embodiment of the present disclosure, may additionally include a memory region that stores information regarding the number of times all logic level combinations of an address are input, and may perform a smart refresh operation of refreshing word lines that are adjacent to a most frequently activated word line, according to a result of counting all the logic level combinations of the address. Also, the electronic device 1 may store the result of counting all the logic level combinations of the address, and, by using the result, may refresh the word lines that are adjacent to the most frequently activated word line, thereby preventing an interference phenomenon between the word lines.

Figure 12:
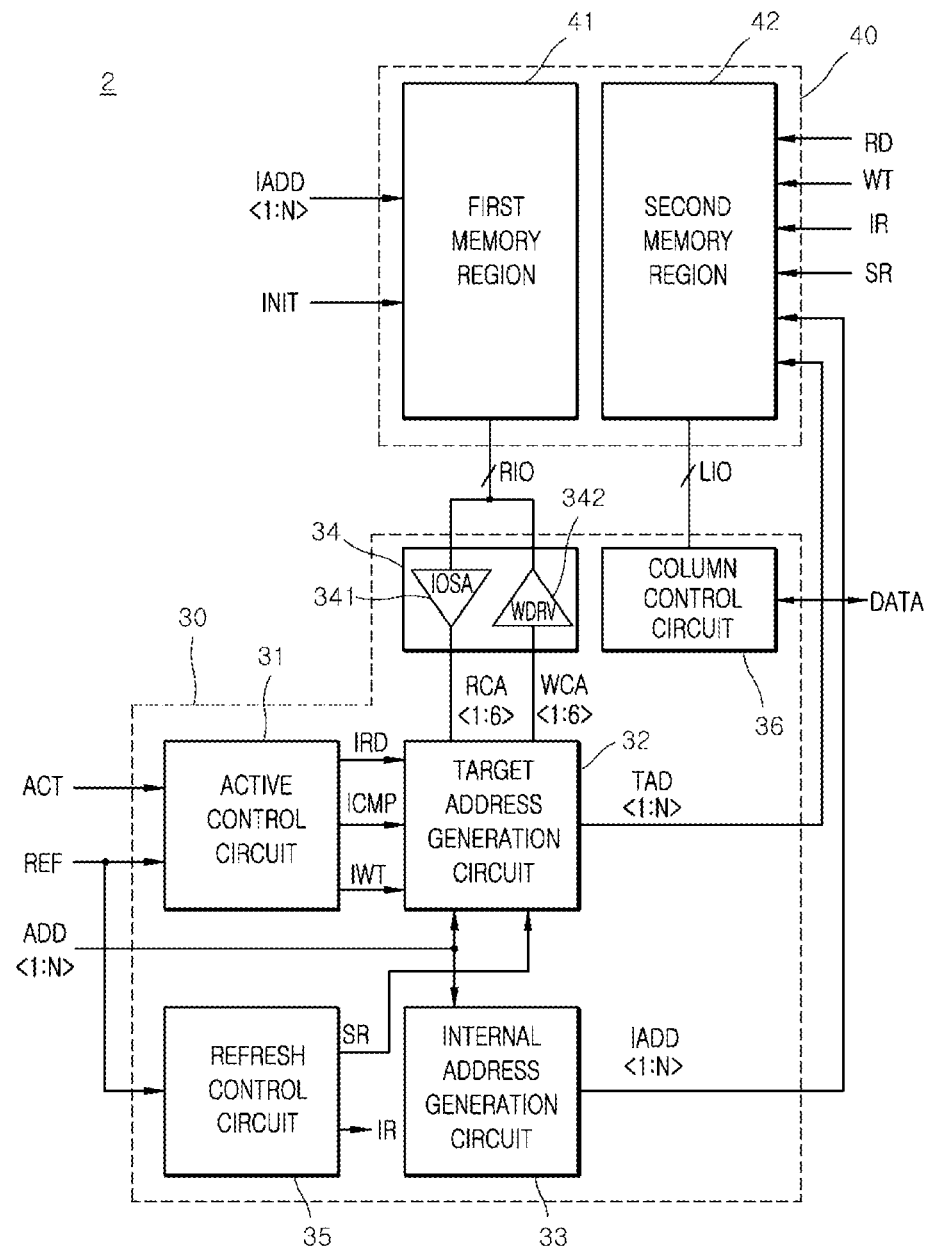
FIG. 12 is a block diagram illustrating a configuration of an electronic device in accordance with another embodiment of the present disclosure.

As illustrated in FIG. 12, an electronic device 2 in accordance with another embodiment of the present disclosure may include an active control circuit 31, a target address generation circuit 32, an internal address generation circuit 33, a counting signal input/output circuit 34, a refresh control circuit 35, a column control circuit 36, a first memory region 41 and a second memory region 42.

The active control circuit 31 may receive an active command ACT and a refresh command REF from an external device (e.g., a controller). The active control circuit 31 may generate an internal read signal IRD, an internal comparison signal ICMP, and an internal write signal IWT based on the active command ACT and the refresh command REF. The active control circuit 31 may generate the internal read signal IRD, the internal comparison signal ICMP, and the internal write signal IWT that are sequentially generated based on the active command ACT. The active control circuit 31 may generate the internal write signal IWT based on the refresh command REF. Since the active control circuit 31 is implemented by the same circuit and performs the same operation as the active control circuit 11, illustrated in FIG. 1, detailed description thereof will be omitted herein.

The target address generation circuit 32 may receive the internal read signal IRD, the internal comparison signal ICMP, and the internal write signal IWT from the active control circuit 31. The target address generation circuit 32 may receive first to Nth addresses ADD<1:N> from the external device (e.g., the controller). The target address generation circuit 32 may receive a smart refresh signal SR from the refresh control circuit 35. In an internal read operation, the target address generation circuit 32 may generate first to sixth counting signals TWC<1:6> (see FIG. 4) by up-counting first to sixth read counting signals RCA<1:6> as information regarding the number of times the logic level combinations of the first to Nth addresses ADD<1:N> are input. When the internal read signal IRD is input, the target address generation circuit 32 may generate the first to sixth counting signals TWC<1:6> (see FIG. 4) by up-counting the first to sixth read counting signals RCA<1:6> that are input from the counting signal input/output circuit 34. When the first to sixth counting signals TWC<1:6> (see FIG. 4) are counted more than the first to sixth storage counting signals SWC<1:6> (see FIG. 5), the target address generation circuit 32 may store the first to sixth counting signals TWC<1:6> (see FIG. 4) as the first to sixth storage counting signals SWC<1:6> (see FIG. 5). The target address generation circuit 32 may store the first to Nth addresses ADD<1:N>, corresponding to the first to sixth counting signals TWC<1:6> (see FIG. 4), as first to Nth target addresses TAD<1:N> by receiving the smart refresh signal SR. The target address generation circuit 32 may, by receiving the internal write signal IWT, output first to sixth write counting signals WCA<1:6>, generated based on the first to sixth counting signals TWC<1:6> (see FIG. 4), to the counting signal input/output circuit 34. The target address generation circuit 32 may store the first to sixth counting signals TWC<1:6> (see FIG. 4) that are counted the most as the first to sixth storage counting signals SWC<1:6> (see FIG. 5). In a smart refresh operation, the target address generation circuit 32 may initialize the first to sixth storage counting signals SWC<1:6> (see FIG. 5). Since the target address generation circuit 32 is implemented by the same circuit and performs the same operation as the target address generation circuit 12, illustrated in FIG. 1, detailed description thereof will be omitted herein.

The internal address generation circuit 33 may receive the first to Nth addresses ADD<1:N> from the external device (e.g., the controller). The internal address generation circuit 33 may generate first to Nth internal addresses IADD<1:N> based on the first to Nth addresses ADD<1:N>. The internal address generation circuit 33 may output the first to Nth addresses ADD<1:N> as the first to Nth internal addresses IADD<1:N>. While the internal address generation circuit 33 is implemented to output the first to Nth addresses ADD<1:N> as the first to Nth internal addresses IADD<1:N>, the internal address generation circuit 33 may be implemented to generate the first to Nth internal addresses IADD<1:N> by decoding the first to Nth addresses ADD<1:N>. The number of bits of the first to Nth addresses ADD<1:N> and the number of bits of the first to Nth internal addresses IADD<1:N> may be variously set depending on an embodiment.

The counting signal input/output circuit 34 may be located between the target address generation circuit 32 and the first memory region 41. The counting signal input/output circuit 34 may be coupled to the first memory region 41 through a row hammering input/output line RIO. The counting signal input/output circuit 34 may include an input/output sense amplifier 341 and a write driver 342. In the internal read operation, the input/output sense amplifier 341 may output the first to sixth read counting signals RCA<1:6>, output to the row hammering input/output line RIO from the first memory region 41, to the target address generation circuit 32. In an internal write operation, the write driver 342 may output the first to sixth write counting signals WCA<1:6>, output from the target address generation circuit 32, to the row hammering input/output line RIO. The row hammering input/output line RIO may be set to include a plurality of row hammering input/output lines.

The refresh control circuit 35 may receive the refresh command REF from the external device (e.g., the controller). The refresh control circuit 35 may generate the smart refresh signal SR and an internal refresh signal IR based on the refresh command REF. The refresh control circuit 35 may generate the smart refresh signal SR that is enabled when the refresh command REF is repeatedly input a predetermined number of times for performing the smart refresh operation. The refresh control circuit 35 may generate the internal refresh signal IR that is enabled when the refresh command REF is repeatedly input a predetermined number of times for performing a self refresh operation. Since the refresh control circuit 35 is implemented by the same circuit and performs the same operation as the refresh control circuit 14, illustrated in FIG. 1, detailed description thereof will be omitted herein.

The column control circuit 36 may be coupled to the second memory region 42 through a local input/output line LIO. In a read operation, the column control circuit 36 may output data DATA, output to the local input/output line LIO from the second memory region 42, to the external device (e.g., the controller). In a write operation, the column control circuit 36 may output data DATA, input from the external device (e.g., the controller), to the local input/output line LIO. The column control circuit 36 may be implemented by a circuit that performs an operation of inputting and outputting data in a general memory device. The local input/output line LIO may be set to include a plurality of local input/output lines.

The first memory region 41 may include first to sixteenth row hammering word lines RWL1 to RWL16 (see FIGS. 2 and 9). The first memory region 41 may include a plurality of row hammering cells RC (see FIGS. 2 and 9) that are coupled to the first to sixteenth row hammering word lines RWL1 to RWL16 (see FIGS. 2 and 9). In the internal read operation, the first memory region 41 may output, to the row hammering input/output line RIO, the first to sixth read counting signals RCA<1:6>, stored in row hammering cells RC (see FIGS. 2 and 9), coupled to a row hammering word line that is selected among the first to sixteenth row hammering word lines RWL1 to RWL16 (see FIGS. 2 and 9) by the first to Nth internal addresses IADD<1:N>. In the internal write operation, the first memory region 41 may store the first to sixth write counting signals WCA<1:6>, loaded on the row hammering input/output line RIO, in row hammering cells RC (see FIGS. 2 and 9) that are coupled to a row hammering word line, among the first to sixteenth row hammering word lines RWL1 to RWL16 (see FIGS. 2 and 9), selected by the first to Nth internal addresses IADD<1:N>. The first memory region 41 may initialize the first to sixth write counting signals WCA<1:6> that are stored therein, by receiving an initialization signal INIT that is input during a power-up period and a boot-up operation for the electronic device 2 to start an operation. All bits of the first to sixth write counting signals WCA<1:6> that are initialized may be generated at logic low levels. While the first memory region 41 is implemented to include the first to sixteenth row hammering word lines RWL1 to RWL16 (see FIGS. 2 and 9), the first memory region 41 may be implemented to include various numbers of row hammering word lines depending on an embodiment. The first memory region 41 may store the first to sixth write counting signals WCA<1:6>, as information regarding the number of times the logic level combinations of the first to Nth addresses ADD<1:N> are input for activating first to sixteenth word lines WL1 to WL16 (see FIGS. 2 and 9), included in the second memory region 42, in the row hammering cells RC (see FIGS. 2 and 9) that are coupled to the first to sixteenth row hammering word lines RWL1 to RWL16 (see FIGS. 2 and 9). Since the first memory region 41 is implemented in the same manner and performs the same operation as the first memory region 21, illustrated in FIGS. 2 and 9, detailed description thereof will be omitted herein.

The second memory region 42 may include the first to sixteenth word lines WL1 to WL16 (see FIGS. 2 and 9). The second memory region 42 may include a plurality of memory cells MC (see FIGS. 2 and 9) that are coupled to the first to sixteenth word lines WL1 to WL16 (see FIGS. 2 and 9). In the read operation, the second memory region 42 may receive a read signal RD and thereby output, to the local input/output line LIO, data DATA that is stored in memory cells MC (see FIGS. 2 and 9) that are coupled to a word line, among the first to sixteenth word lines WL1 to WL16 (see FIGS. 2 and 9), selected by the first to Nth internal addresses IADD<1:N>. In the write operation, the second memory region 42 may receive a write signal WT and thereby store data DATA, loaded on the local input/output line LIO, in memory cells MC (see FIGS. 2 and 9) that are coupled to a word line, among the first to sixteenth word lines WL1 to WL16 (see FIGS. 2 and 9), selected by the first to Nth internal addresses IADD<1:N>. In the self refresh operation, the second memory region 42 may receive the internal refresh signal IR and thereby perform a refresh operation on the first to sixteenth word lines WL1 to WL16 (see FIGS. 2 and 9). In the smart refresh operation, the second memory region 42 may refresh word lines that are adjacent to a word line that is selected by the first to Nth target addresses TAD<1:N>. The read signal RD and the write signal WT may be set as signals that are internally generated by commands input from the external device (e.g., the controller) in a general read operation and write operation. While the second memory region 42 is implemented to include the first to sixteenth word lines WL1 to WL16 (see FIGS. 2 and 9), the second memory region 42 may be implemented to include various numbers of word lines depending on an embodiment. Since the second memory region 42 is implemented in the same manner and performs the same operation as the second memory region 22, illustrated in FIGS. 2 and 9, detailed description thereof will be omitted herein.

Among the first to sixteenth row hammering word lines RWL1 to RWL16 (see FIGS. 2 and 9) that are included in the first memory region 41 and the first to sixteenth word lines WL1 to WL16 (see FIGS. 2 and 9) that are included in the second memory region 42, word lines of the same order may be simultaneously activated by the first to Nth internal addresses IADD<1:N>. For example, when the first row hammering word line RWL1 (see FIGS. 2 and 9) that are included in the first memory region 41 is activated by the first to Nth internal addresses IADD<1:N>, the first word line WL1 (see FIGS. 2 and 9) that are included in the second memory region 42 may be activated. While the first to sixteenth row hammering word lines RWL1 to RWL16 (see FIGS. 2 and 9) that are included in the first memory region 41 and the first to sixteenth word lines WL1 to WL16 (see FIGS. 2 and 9) that are included in the second memory region 42 are implemented by different word lines, this is merely an example, and the first to sixteenth row hammering word lines RWL1 to RWL16 and the first to sixteenth word lines WL1 to WL16 may be implemented by the same word lines.

The active control circuit 31, the target address generation circuit 32, the internal address generation circuit 33, the counting signal input/output circuit 34, the refresh control circuit 35, and the column control circuit 36 may be located in a column area 30 (COLUMN AREA of FIG. 2) for controlling a memory region 40 that includes the first memory region 41 and the second memory region 42, or may be located in both the column area 30 (COLUMN AREA of FIG. 2) and a cross area CROSS AREA (see FIG. 2).

As is apparent from the above description, the electronic device 2, in accordance with the embodiment of the present disclosure, may additionally include a memory region that stores information regarding the number of times all logic level combinations of an address are input, and may perform a smart refresh operation of refreshing word lines that are adjacent to a most frequently activated word line, according to a result of counting all the logic level combinations of the address. Also, the electronic device 2 may store the result of counting all the logic level combinations of the address, and, by using the result, may refresh the word lines that are adjacent to the most frequently activated word line, thereby preventing an interference phenomenon between word lines.

Figure 13:
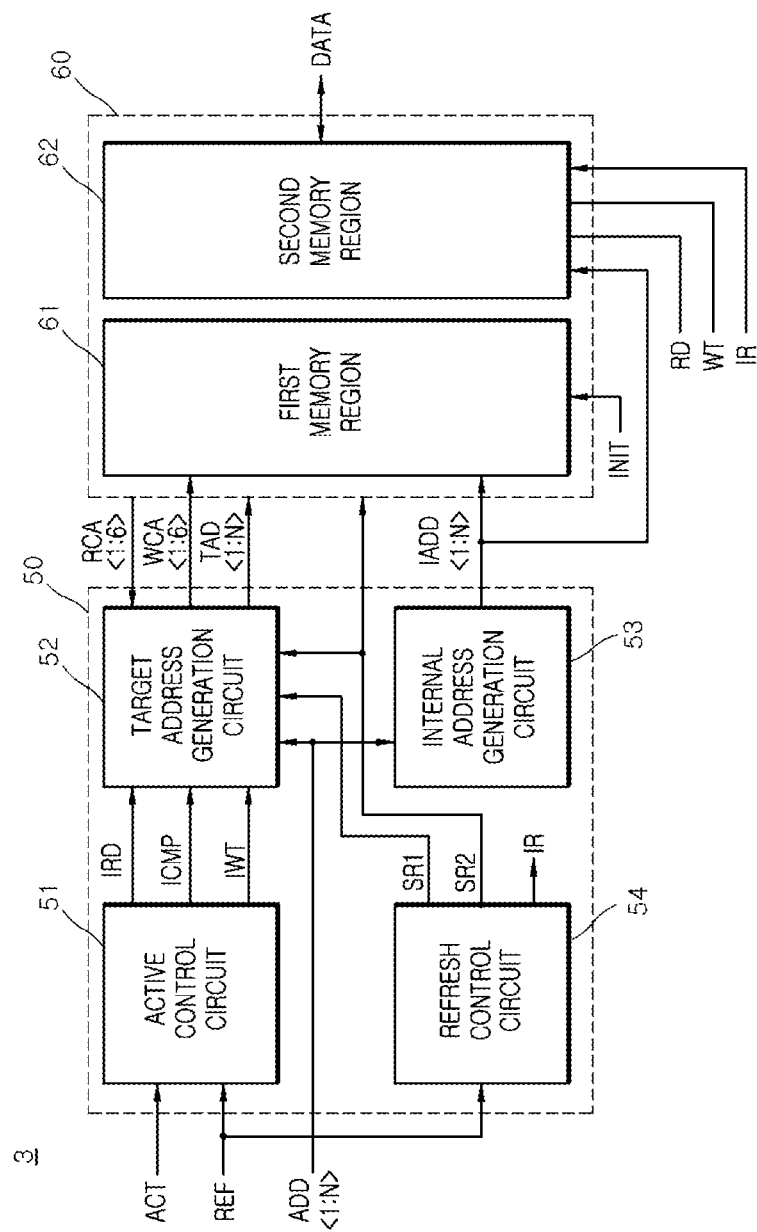
FIG. 13 is a block diagram illustrating a configuration of an electronic device in accordance with another embodiment of the present disclosure.

As illustrated in FIG. 13, an electronic device 3, in accordance with another embodiment of the present disclosure, may include an active control circuit 51, a target address generation circuit 52, an internal address generation circuit 53, a refresh control circuit 54, a first memory region 61, and a second memory region 62.

The active control circuit 51 may receive an active command ACT and a refresh command REF from an external device (e.g., a controller). The active control circuit 51 may generate an internal read signal IRD, an internal comparison signal ICMP, and an internal write signal IWT based on the active command ACT and the refresh command REF. The active control circuit 51 may generate the internal read signal IRD, the internal comparison signal ICMP, and the internal write signal IWT that are sequentially generated based on the active command ACT. The active control circuit 51 may generate the internal write signal IWT based on the refresh command REF. Since the active control circuit 51 is implemented by the same circuit and performs the same operation as the active control circuit 11, illustrated in FIG. 1, detailed description thereof will be omitted herein.

The target address generation circuit 52 may receive the internal read signal IRD, the internal comparison signal ICMP, and the internal write signal IWT from the active control circuit 51. The target address generation circuit 52 may receive first to Nth addresses ADD<1:N> from the external device (e.g., the controller). The target address generation circuit 52 may receive a first smart refresh signal SR1 and a second smart refresh signal SR2 from the refresh control circuit 54. In an internal read operation, the target address generation circuit 52 may generate first to sixth counting signals TWC<1:6> (see FIG. 14) by up-counting first to sixth read counting signals RCA<1:6> as information regarding the number of times the logic level combinations of the first to Nth addresses ADD<1:N> are input. When the internal read signal IRD is input, the target address generation circuit 52 may generate the first to sixth counting signals TWC<1:6> (see FIG. 14) by up-counting the first to sixth read counting signals RCA<1:6> which are input from the first memory region 61. When the first to sixth counting signals TWC<1:6> (see FIG. 14) are counted more than first to sixth storage counting signals SWC<1:6> (see FIG. 5), the target address generation circuit 52 may store the first to sixth counting signals TWC<1:6> (see FIG. 14) as the first to sixth storage counting signals SWC<1:6> (see FIG. 5). The target address generation circuit 52 may store the first to Nth addresses ADD<1:N>, corresponding to the first to sixth counting signals TWC<1:6> (see FIG. 14), as first to Nth target addresses TAD<1:N> by receiving the first smart refresh signal SR1 and the second smart refresh signal SR2. In an internal write operation, the target address generation circuit 52 may output first to sixth write counting signals WCA<1:6>, generated based on the first to sixth counting signals TWC<1:6> (see FIG. 14), to the first memory region 61. The target address generation circuit 52 may, by receiving the internal write signal IWT, output the first to sixth write counting signals WCA<1:6>, generated based on the first to sixth counting signals TWC<1:6> (see FIG. 14), to the first memory region 61. The target address generation circuit 52 may store the first to sixth counting signals TWC<1:6> (see FIG. 14) that are counted the most, as the first to sixth storage counting signals SWC<1:6> (see FIG. 5). The target address generation circuit 52 may store the first to sixth counting signals TWC<1:6> (see FIG. 14) that are counted the most, as the first to sixth storage counting signals SWC<1:6> (see FIG. 5). In a smart refresh operation, the target address generation circuit 52 may initialize the first to sixth storage counting signals SWC<1:6> (see FIG. 5).

The internal address generation circuit 53 may receive the first to Nth addresses ADD<1:N> from the external device (e.g., the controller). The internal address generation circuit 53 may generate first to Nth internal addresses IADD<1:N> based on the first to Nth addresses ADD<1:N>. The internal address generation circuit 53 may output the first to Nth addresses ADD<1:N> as the first to Nth internal addresses IADD<1:N>. While the internal address generation circuit 53 is implemented to output the first to Nth addresses ADD<1:N> as the first to Nth internal addresses IADD<1:N>, the internal address generation circuit 53 may be implemented to generate the first to Nth internal addresses IADD<1:N> by decoding the first to Nth addresses ADD<1:N>. The number of bits of the first to Nth addresses ADD<1:N> and the number of bits of the first to Nth internal addresses IADD<1:N> may be variously set depending on an embodiment.

The refresh control circuit 54 may receive the refresh command REF from the external device (e.g., the controller). The refresh control circuit 54 may generate the first smart refresh signal SR1, the second smart refresh signal SR2, and an internal refresh signal IR based on the refresh command REF. The refresh control circuit 54 may generate the first smart refresh signal SR1 and the second smart refresh signal SR2 that are sequentially enabled when the refresh command REF is repeatedly input a predetermined number of times for performing the smart refresh operation. The refresh control circuit 54 may generate the internal refresh signal IR that is enabled when the refresh command REF is repeatedly input a predetermined number of times for performing a self refresh operation.

The first memory region 61 may include first to sixteenth row hammering word lines RWL1 to RWL16 (see FIGS. 2 and 9). The first memory region 61 may include a plurality of row hammering cells RC (see FIGS. 2 and 9) that are coupled to the first to sixteenth row hammering word lines RWL1 to RWL16 (see FIGS. 2 and 9). In the internal read operation, the first memory region 61 may output, as the first to sixth read counting signals RCA<1:6>, the first to sixth write counting signals WCA<1:6>, stored in row hammering cells RC (see FIGS. 2 and 9), coupled to a row hammering word line, among the first to sixteenth row hammering word lines RWL1 to RWL16 (see FIGS. 2 and 9), selected by the first to Nth internal addresses IADD<1:N>. In the internal write operation, the first memory region 61 may store the first to sixth write counting signals WCA<1:6> in row hammering cells RC (see FIGS. 2 and 9) that are coupled to a row hammering word line, among the first to sixteenth row hammering word lines RWL1 to RWL16 (see FIGS. 2 and 9), selected by the first to Nth internal addresses IADD<1:N>. The first memory region 61 may initialize the first to sixth write counting signals WCA<1:6> that are stored therein, by receiving an initialization signal INIT that is input during a power-up period and a boot-up operation for the electronic device 3 to start an operation. All bits of the first to sixth write counting signals WCA<1:6> that are initialized may be generated at logic low levels. While the first memory region 61 is implemented to include the first to sixteenth row hammering word lines RWL1 to RWL16 (see FIGS. 2 and 9), the first memory region 61 may be implemented to include various numbers of row hammering word lines depending on an embodiment. The first memory region 61 may store the first to sixth write counting signals WCA<1:6>, as information regarding the number of times the logic level combinations of the first to Nth addresses ADD<1:N> are input for activating first to sixteenth word lines WL1 to WL16 (see FIGS. 2 and 9) included in the second memory region 62, in the row hammering cells RC (see FIGS. 2 and 9) coupled to the first to sixteenth row hammering word lines RWL1 to RWL16 (see FIGS. 2 and 9). Since the first memory region 61 is implemented in the same manner and performs the same operation as the first memory region 21, illustrated in FIGS. 2 and 9, detailed description thereof will be omitted herein.

The second memory region 62 may include the first to sixteenth word lines WL1 to WL16 (see FIGS. 2 and 9). The second memory region 62 may include a plurality of memory cells MC (see FIGS. 2 and 9) that are coupled to the first to sixteenth word lines WL1 to WL16 (see FIGS. 2 and 9). In a read operation, the second memory region 62 may receive a read signal RD and thereby output data DATA that is stored in memory cells MC (see FIGS. 2 and 9) that are coupled to a word line, among the first to sixteenth word lines WL1 to WL16 (see FIGS. 2 and 9), selected by the first to Nth internal addresses IADD<1:N>. In a write operation, the second memory region 62 may receive a write signal WT and thereby store data DATA in memory cells MC (see FIGS. 2 and 9) that are coupled to a word line that is selected among the first to sixteenth word lines WL1 to WL16 (see FIGS. 2 and 9) by the first to Nth internal addresses IADD<1:N>. In the self refresh operation, the second memory region 62 may receive the internal refresh signal IR and thereby perform a refresh operation on the first to sixteenth word lines WL1 to WL16 (see FIGS. 2 and 9). In the smart refresh operation, the second memory region 62 may refresh word lines that are adjacent to a word line that is selected by the first to Nth target addresses TAD<1:N>. The read signal RD and the write signal WT may be set as signals that are internally generated by commands that are input from the external device (e.g., the controller) in a general read operation and write operation. While the second memory region 62 is implemented to include the first to sixteenth word lines WL1 to WL16 (see FIGS. 2 and 9), the second memory region 62 may be implemented to include various numbers of word lines depending on an embodiment. Since the second memory region 62 is implemented in the same manner and performs the same operation as the second memory region 22, illustrated in FIGS. 2 and 9, detailed description thereof will be omitted herein.

Among the first to sixteenth row hammering word lines RWL1 to RWL16 (see FIGS. 2 and 9) that are included in the first memory region 61 and the first to sixteenth word lines WL1 to WL16 (see FIGS. 2 and 9) that are included in the second memory region 62, word lines of the same order may be simultaneously activated by the first to Nth internal addresses IADD<1:N>. For example, when the first row hammering word line RWL1 (see FIGS. 2 and 9) that are included in the first memory region 61 is activated by the first to Nth internal addresses IADD<1:N>, the first word line WL1 (see FIGS. 2 and 9) that are included in the second memory region 62 may be activated. While the first to sixteenth row hammering word lines RWL1 to RWL16 (see FIGS. 2 and 9) that are included in the first memory region 61 and the first to sixteenth word lines WL1 to WL16 (see FIGS. 2 and 9) that are included in the second memory region 62 are implemented by different word lines, this is merely an example, and the first to sixteenth row hammering word lines RWL1 to RWL16 and the first to sixteenth word lines WL1 to WL16 may be implemented by the same word lines.

The active control circuit 51, the target address generation circuit 52, the internal address generation circuit 53, and the refresh control circuit 54 may be located in a row area 50 (ROW AREA of FIG. 2) for controlling a memory region 60 with the first memory region 61 and the second memory region 62, or may be located in both the row area 50 (ROW AREA of FIG. 2) and a cross area CROSS AREA (see FIG. 2). Alternatively, the active control circuit 51, the target address generation circuit 52, the internal address generation circuit 53, and the refresh control circuit 54 may be implemented to be located in a column area COLUMN AREA (see FIG. 2) for controlling the memory region 60, or to be located in both the column area COLUMN AREA (see FIG. 2) and the cross area CROSS AREA (see FIG. 2).

Figure 14:
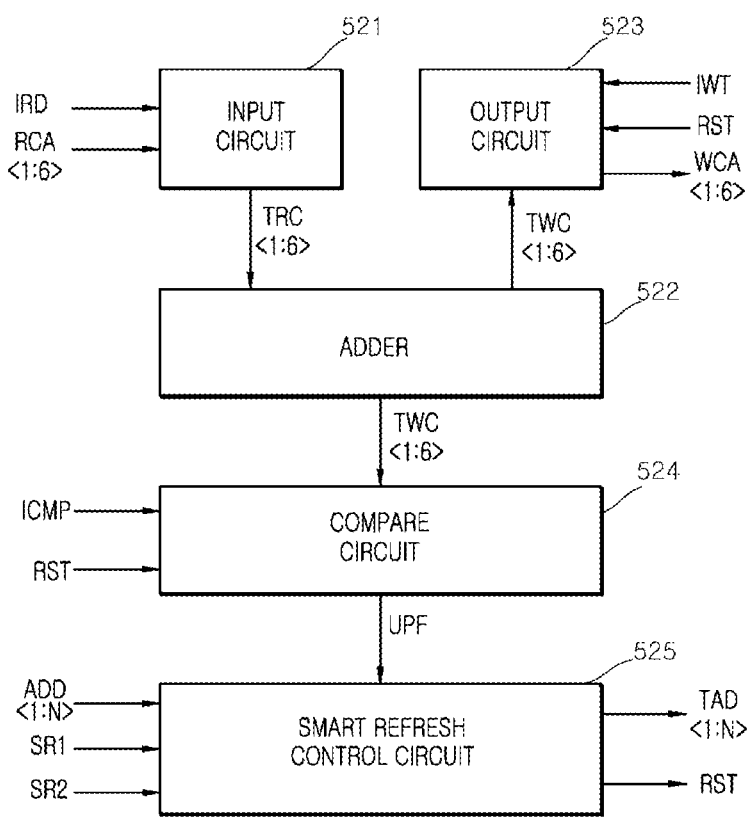
FIG. 14 is a block diagram illustrating a configuration of a target address generation circuit included in the electronic device illustrated in FIG. 13.

FIG. 14 is a block diagram illustrating an embodiment of the target address generation circuit 52. As illustrated in FIG. 14, the target address generation circuit 52 may include an input circuit 521, an adder 522, an output circuit 523, a compare circuit 524, and a smart refresh control circuit 525.

When the internal read signal IRD is input, the input circuit 521 may generate first to sixth transfer read counting signals TRC<1:6> based on the first to sixth read counting signals RCA<1:6> that are received from the first memory region 61. When the internal read signal IRD is input, the input circuit 521 may generate the first to sixth transfer read counting signals TRC<1:6> by buffering the first to sixth read counting signals RCA<1:6>.

The adder 522 may up-count the first to sixth transfer read counting signals TRC<1:6>. The adder 522 may generate the first to sixth counting signals TWC<1:6> by up-count the first to sixth transfer read counting signals TRC<1:6>.

In the internal write operation, the output circuit 523 may generate the first to sixth write counting signals WCA<1:6> based on the first to sixth counting signals TWC<1:6>. When the internal write signal IWT is input, the output circuit 523 may generate the first to sixth write counting signals WCA<1:6> based on the first to sixth counting signals TWC<1:6>. When the internal write signal IWT is input, the output circuit 523 may output the first to sixth write counting signals WCA<1:6> to the first memory region 61. After the smart refresh operation is performed, the output circuit 523 may initialize all bits of the first to sixth write counting signals WCA<1:6> to logic low levels. When a reset signal RST is input after the smart refresh operation is performed, the output circuit 523 may initialize all bits of the first to sixth write counting signals WCA<1:6> to logic low levels. When the internal write signal IWT is input after the smart refresh operation is performed, the output circuit 523 may output the first to sixth write counting signals WCA<1:6> of which all bits are initialized to logic low levels, to the first memory region 61.

When the internal comparison signal ICMP is input, the compare circuit 524 may generate a flag signal UPF by comparing the first to sixth counting signals TWC<1:6> and the first to sixth storage counting signals SWC<1:6> (see FIG. 5) that are stored therein. When the internal comparison signal ICMP is input, the compare circuit 524 may generate the flag signal UPF that is enabled in the case in which the first to sixth counting signals TWC<1:6> are counted more than the first to sixth storage counting signals SWC<1:6> (see FIG. 5) that are stored therein. When the internal comparison signal ICMP is input, the compare circuit 524 may generate the flag signal UPF that is disabled in the case in which the first to sixth counting signals TWC<1:6> are counted less than or equal to the first to sixth storage counting signals SWC<1:6> (see FIG. 5) stored therein. When the internal comparison signal ICMP is input, the compare circuit 524 may store the first to sixth counting signals TWC<1:6> as the first to sixth storage counting signals SWC<1:6> (see FIG. 5) in the case in which the first to sixth counting signals TWC<1:6> are counted more than the first to sixth storage counting signals SWC<1:6> (see FIG. 5) stored therein. When the reset signal RST is input in the smart refresh operation, the compare circuit 524 may initialize all bits of the first to sixth storage counting signals SWC<1:6> (see FIG. 5) to logic low levels.

When the flag signal UPF is input, the smart refresh control circuit 525 may store the first to Nth addresses ADD<1:N>. When the first smart refresh signal SR1 is input, the smart refresh control circuit 525 may generate the first to Nth target addresses TAD<1:N> based on the stored first to Nth addresses ADD<1:N>. When the second smart refresh signal SR2 is input, the smart refresh control circuit 525 may output the first to Nth target addresses TAD<1:N> to the second memory region 62. The smart refresh control circuit 525 may generate the reset signal RST that is enabled after the first smart refresh signal SR1 is input.

Figure 15:
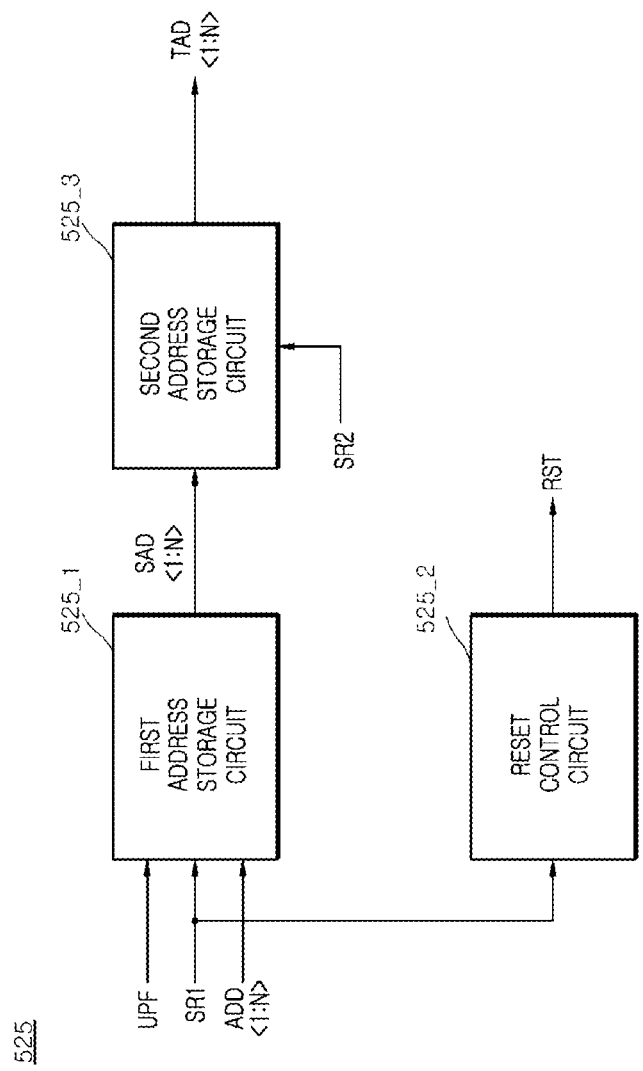
FIG. 15 is a block diagram illustrating a configuration of a smart refresh control circuit included in the target address generation circuit illustrated in FIG. 14.

FIG. 15 is a block diagram illustrating an embodiment of the smart refresh control circuit 525. As illustrated in FIG. 15, the smart refresh control circuit 525 may include a first address storage circuit 525_1, a reset control circuit 525_2 and a second address storage circuit 525_3.

The first address storage circuit 525_1 may generate first to Nth storage addresses SAD<1:N> from the first to Nth addresses ADD<1:N> based on the flag signal UPF and the first smart refresh signal SR1. When the flag signal UPF is input at a logic high level, the first address storage circuit 525_1 may store the first to Nth addresses ADD<1:N> as the first to Nth storage addresses SAD<1:N>. When the first smart refresh signal SR1 is input at a logic high level, the first address storage circuit 525_1 may output the stored first to Nth storage addresses SAD<1:N>.

The reset control circuit 525_2 may generate the reset signal RST based on the first smart refresh signal SR1. The reset control circuit 525_2 may generate the reset signal RST that is enabled when the first smart refresh signal SR1 is input.

The second address storage circuit 525_3 may store the first to Nth storage addresses SAD<1:N>. When the second smart refresh signal SR2 is input at a logic high level, the second address storage circuit 525_3 may output the stored first to Nth storage addresses SAD<1:N> as the first to Nth target addresses TAD<1:N>.

Figure 16:
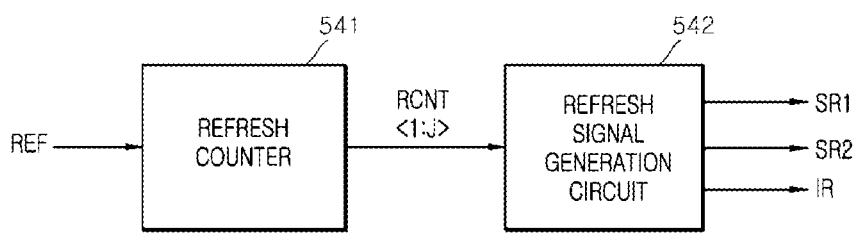
FIG. 16 is a block diagram illustrating a configuration of a refresh control circuit included in the electronic device illustrated in FIG. 13.

FIG. 16 is a block diagram illustrating an embodiment of the refresh control circuit 54. As illustrated in FIG. 16, the refresh control circuit 54 may include a refresh counter 541 and a refresh signal generation circuit 542.

The refresh counter 541 may generate first to Jth refresh counting signals RCNT<1:J> based on the refresh command REF. The refresh counter 541 may generate the first to Jth refresh counting signals RCNT<1:J> that are up-counted each time the refresh command REF is input.

The refresh signal generation circuit 542 may generate the first smart refresh signal SR1, the second smart refresh signal SR2, and the internal refresh signal IR based on the first to Jth refresh counting signals RCNT<1:J>. The refresh signal generation circuit 142 may generate the first smart refresh signal SR1 and the second smart refresh signal SR2 that are sequentially enabled when the first to Jth refresh counting signals RCNT<1:J> are counted as a fourth logic level combination. The fourth logic level combination of the first to Jth refresh counting signals RCNT<1:J> may be set as the number of times the refresh command REF is input to perform the smart refresh operation. The refresh signal generation circuit 542 may generate the internal refresh signal IR when the first to Jth refresh counting signals RCNT<1:J> are counted as a fifth logic level combination. The fifth logic level combination of the first to Jth refresh counting signals RCNT<1:J> may be set as the number of times the refresh command REF is input to perform the self refresh operation.

Figure 17:
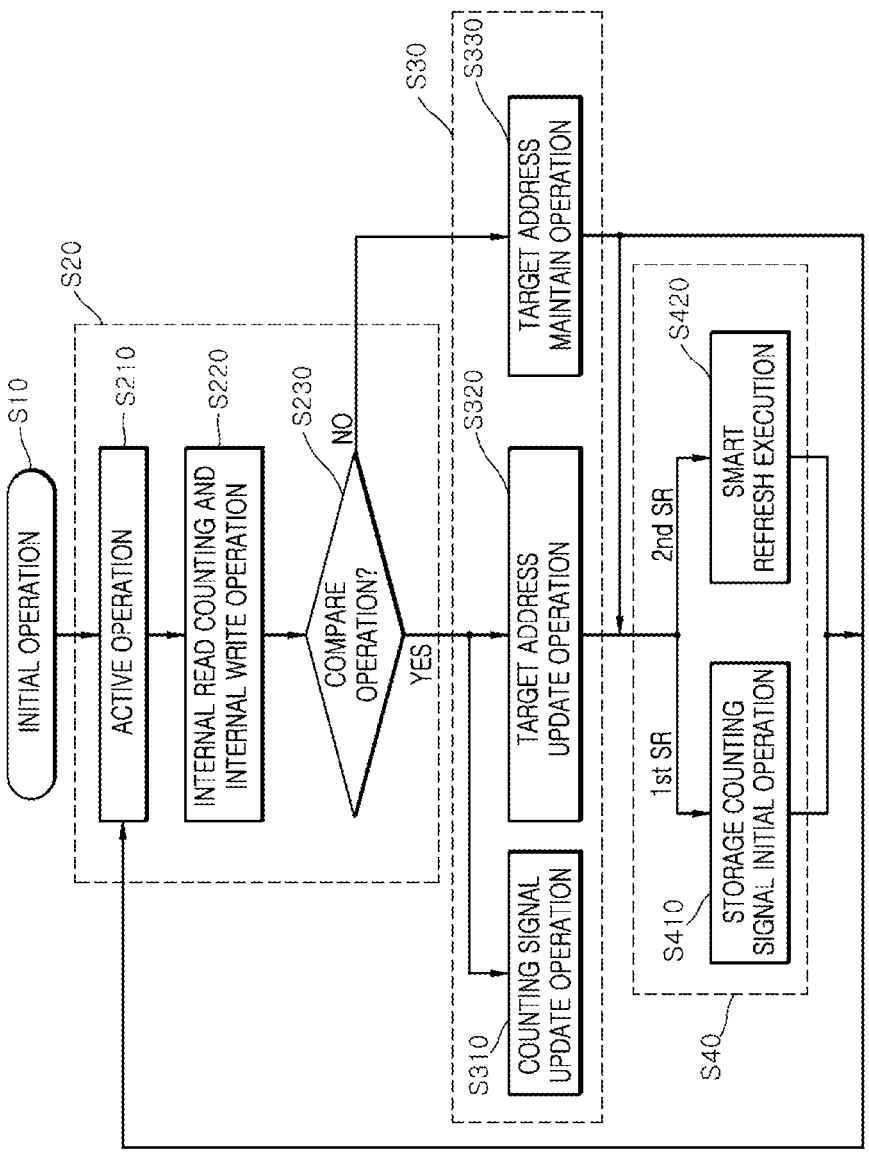
FIG. 17 is a flowchart for explaining a smart refresh operation of the electronic device in accordance with the other embodiment of the present disclosure.

The smart refresh operation of the electronic device 3 in accordance with the embodiment of the present disclosure will be described below with reference to FIG. 17.

The smart refresh operation may include initialization operation step S10, active detection step S20, target address generation step S30, and smart refresh operation step S40.

The initialization operation step S10 may be set as a power-up period and a boot-up operation for the electronic device 3 to start an operation. At the initialization operation step S10, the first memory region 61 may receive the initialization signal INIT and thereby initialize the first to sixth write counting signals WCA<1:6> that are stored therein. The first to sixth write counting signals WCA<1:6> that are stored therein may refer to the first to sixth write counting signals WCA<1:6> that are stored in the first to sixteenth row hammering word lines RWL1 to RWL16, respectively. All bits of the first to sixth write counting signals WCA<1:6> may be initialized to logic low levels.

The active detection step S20 may include active operation step S210, internal read, counting, and internal write operation step S220 and compare operation step S230.

The active operation step S210 may be set as a step of receiving the active command ACT, the refresh command REF, and the first to Nth addresses ADD<1:N> from the external device (e.g., the controller).

The internal read, counting, and internal write operation step S220 may be set as a step of generating the internal read signal IRD, the internal comparison signal ICMP and the internal write signal IWT based on the active command ACT. At the internal read, counting, and internal write operation step S220, the active control circuit 51 may generate the internal read signal IRD, the internal comparison signal ICMP and the internal write signal IWT based on the active command ACT. When the internal read signal IRD is generated at the internal read, counting, and internal write operation step S220, the target address generation circuit 52 may generate the first to sixth counting signals TWC<1:6> by up-counting the first to sixth read counting signals RCA<1:6> that are input from the first memory region 61. At the internal read, counting, and internal write operation step S220, after generating the internal read signal IRD, the active control circuit 51 may generate the internal comparison signal ICMP and the internal write signal IWT. When the internal write signal IWT is generated at the internal read, counting, and internal write operation step S220, the target address generation circuit 52 may generate the first to sixth write counting signals WCA<1:6> based on the first to sixth counting signals TWC<1:6>, and may output the first to sixth write counting signals WCA<1:6> to the first memory region 61. At the internal read, counting, and internal write operation step S220, the first memory region 61 may store the first to sixth write counting signals WCA<1:6>.

The compare operation step S230 may be set as an operation of comparing the first to sixth counting signals TWC<1:6> and the first to sixth storage counting signals SWC<1:6>. At the compare operation step S230, the target address generation circuit 52 may compare the first to sixth counting signals TWC<1:6> and the first to sixth storage counting signals SWC<1:6> when the internal comparison signal ICMP is input. At the compare operation step S230, the target signal generation circuit 52 may generate the flag signal UPF that is enabled when the first to sixth counting signals TWC<1:6> are counted more than the first to sixth storage counting signals SWC<1:6> (YES). At the compare operation step S230, the target signal generation circuit 52 may generate the flag signal UPF that is disabled when the first to sixth counting signals TWC<1:6> are counted less than or equal to the first to sixth storage counting signals SWC<1:6> (NO).

The target address generation step S30 may include counting signal update operation step S310, target address update operation step S320 and target address maintain operation step S330.

The counting signal update operation step S310 may be performed when, at the compare operation step S230, the first to sixth counting signals TWC<1:6> are counted more than the first to sixth storage counting signals SWC<1:6> (YES). At the counting signal update operation step S310, the target address generation circuit 52 may store the first to sixth counting signals TWC<1:6> as the first to sixth storage counting signals SWC<1:6> by the flag signal UPF that is enabled.

The target address update operation step S320 may be performed when, at the compare operation step S230, the first to sixth counting signals TWC<1:6> are counted more than the first to sixth storage counting signals SWC<1:6> (YES). At the target address update operation step S320, the target address generation circuit 12 may store the first to Nth addresses ADD<1:N> as the first to Nth target addresses TAD<1:N> by the flag signal UPF that is enabled.

The target address maintain operation step S330 may be performed when, at the compare operation step S230, the first to sixth counting signals TWC<1:6> are counted less than or equal to the first to sixth storage counting signals SWC<1:6> (NO). At the target address maintain operation step S330, the target address generation circuit 52 might not store the first to Nth addresses ADD<1:N> as the first to Nth target addresses TAD<1:N> by the flag signal UPF that is disabled. In other words, the first to Nth target addresses TAD<1:N> may maintain information regarding a most activated word line. When the target address maintain operation step S330 ends, the process may reenter the active operation step S210.

The smart refresh operation step S40 may include storage counting signal initialize operation step S410 and smart refresh execution step S420.

The storage counting signal initialize operation step S410 may be set as a step of initializing the first to sixth storage counting signals SWC<1:6> (see FIG. 5). The storage counting signal initialize operation step S410 may be set as a step of initializing the row hammering cells RC included in the first memory region 61. At the storage counting signal initialize operation step S410, the refresh control circuit 54 may generate the first smart refresh signal SR1 by the refresh command REF. At the storage counting signal initialize operation step S410, the target address generation circuit 54 may initialize all bits of the first to sixth storage counting signals SWC<1:6> (see FIG. 5) to logic low levels by the reset signal RST that is generated by the first smart refresh signal SR1. At the storage counting signal initialize operation step S410, the row hammering cells RC included in the first memory region 61 may be initialized.

The smart refresh execution step S420 may be set as a step of performing the smart refresh operation by the refresh command REF. At the smart refresh execution step S420, when the second smart refresh signal SR2 is input, the target address generation circuit 52 may output the stored first to Nth target addresses TAD<1:N> to the second memory region 62. At the smart refresh execution step S420, the second memory region 62 may perform the smart refresh operation by activating word lines N−1 and N+1 adjacent to a word line that is selected by the first to Nth target addresses TAD<1:N>. When the smart refresh execution step S420 ends, the process may reenter the active operation step S210.

Figure 18:
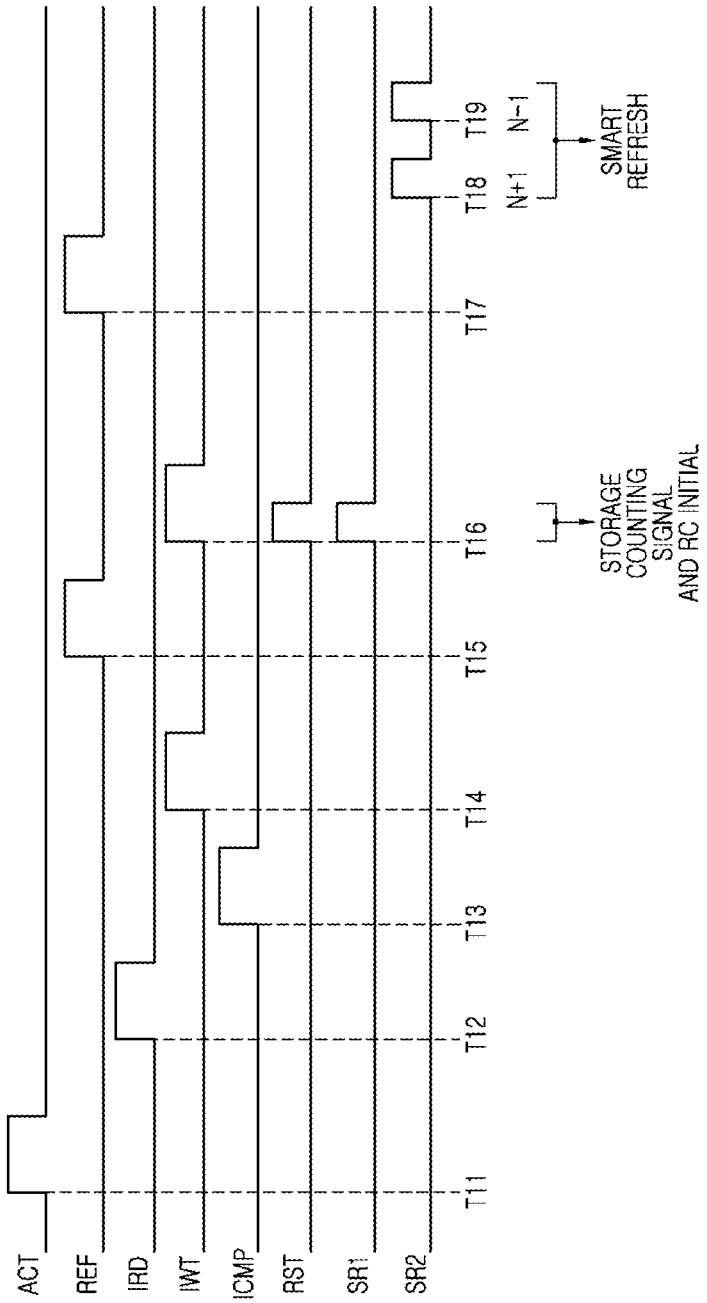
FIG. 18 is a timing diagram for explaining the smart refresh operation of the electronic device in accordance with the other embodiment of the present disclosure.

The smart refresh operation of the electronic device 3 in accordance with the embodiment of the present disclosure will be described below with reference to FIG. 18.

At a time point T11, the active command ACT may be input from the external device (e.g., the controller).

At a time point T12, the active control circuit 51 may generate the internal read signal IRD based on the active command ACT. The target address generation circuit 52 may receive the internal read signal IRD and thereby generate the first to sixth counting signals TWC<1:6> by up-counting the first to sixth read counting signals RCA<1:6> that are input from the first memory region 61.

At a time point T13, the active control circuit 51 may generate the internal comparison signal ICMP based on the active command ACT. The target address generation circuit 52 may generate the flag signal UPF by comparing the first to sixth counting signals TWC<1:6> and the first to sixth storage counting signals SWC<1:6>. When the flag signal UPF is enabled, the target address generation circuit 52 may store the first to Nth addresses ADD<1:N> as the first to Nth storage addresses SAD<1:N>. When the flag signal UPF is enabled, the target address generation circuit 52 may store the first to sixth counting signals TWC<1:6> as the first to sixth storage counting signals SWC<1:6>. The first to sixth storage counting signals SWC<1:6> may be generated based on the first to sixth counting signals TWC<1:6> that are counted the most. When the flag signal UPF is disabled, the target address generation circuit 52 might not store the first to Nth addresses ADD<1:N> as the first to Nth storage addresses SAD<1:N>. When the flag signal UPF is disabled, the target address generation circuit 52 might not store the first to sixth counting signals TWC<1:6> as the first to sixth storage counting signals SWC<1:6>.

At a time point T14, the active control circuit 51 may generate the internal write signal IWT based on the active command ACT. The target address generation circuit 52 may receive the internal write signal IWT and thereby output the first to sixth write counting signals WCA<1:6>, generated based on the first to sixth counting signals TWC<1:6>, to the first memory region 61. The first memory region 61 may store the first to sixth write counting signals WCA<1:6> in row hammering cells RC that are coupled to a row hammering word line, among the first to sixteenth row hammering word lines RWL1 to RWL16, activated by the first to Nth internal addresses IADD<1:N>.

At a time point T15, the refresh command REF may be input from the external device (e.g., the controller).

At a time point T16, the refresh control circuit 54 may generate the first smart refresh signal SR1 based on the refresh command REF. The target address generation circuit 52 may store the first to Nth storage addresses SAD<1:N> as the first to Nth target addresses TAD<1:N> by the first smart refresh signal SR1. The target address generation circuit 52 may generate the reset signal RST when the first smart refresh signal SR1 is input. The refresh control circuit 54 may initialize all bits of the first to sixth storage counting signals SWC<1:6> to logic low levels by the reset signal RST that is generated after the first to Nth storage addresses SAD<1:N> are output. Namely, the first to sixth storage counting signals SWC<1:6> may be initialized (STORAGE COUNTING SIGNAL INITIAL).

The active control circuit 51 may generate the internal write signal IWT based on the refresh command REF. The target address generation circuit 52 may receive the internal write signal IWT and thereby output the first to sixth write counting signals WCA<1:6> of which all bits are initialized to logic low levels, to the first memory region 61. The first memory region 61 may store the initialized first to sixth write counting signals WCA<1:6> in row hammering cells RC that are coupled to a row hammering word line, among the first to sixteenth row hammering word lines RWL1 to RWL16, activated by the first to Nth internal addresses IADD<1:N>. Namely, the row hammering cells RC of the first memory region 61 may be initialized (RC INITIAL).

At a time point T17, the refresh command REF may be input from the external device (e.g., the controller).

At a time point T18, the refresh control circuit 54 may generate a first pulse of the second smart refresh signal SR2 based on the refresh command REF. The target address generation circuit 52 may output the first to Nth target addresses TAD<1:N> to the second memory region 62 by the first pulse of the second smart refresh signal SR2. The second memory region 62 may perform the smart refresh operation by activating a word line N+1 that is adjacent to a word line that is selected by the first to Nth target addresses TAD<1:N> among the first to sixteenth word lines WL1 to WL16 (SMART REFRESH). Meanwhile, the second memory region 62 may perform the smart refresh operation by activating a word line N+2 that is adjacent to a word line that is selected by the first to Nth target addresses TAD<1:N> among the first to sixteenth word lines WL1 to WL16 (SMART REFRESH).

At a time point T19, the refresh control circuit 54 may generate a second pulse of the second smart refresh signal SR2 based on the refresh command REF. The target address generation circuit 52 may output the first to Nth target addresses TAD<1:N> to the second memory region 62 by the second pulse of the second smart refresh signal SR2. The second memory region 62 may perform the smart refresh operation by activating a word line N−1 that is adjacent to a word line that is selected by the first to Nth target addresses TAD<1:N> among the first to sixteenth word lines WL1 to WL16 (SMART REFRESH). Meanwhile, the second memory region 62 may perform the smart refresh operation by activating a word line N−2 that is adjacent to a word line that is selected by the first to Nth target addresses TAD<1:N> among the first to sixteenth word lines WL1 to WL16 (SMART REFRESH).

As is apparent from the above description, the electronic device 3, in accordance with the embodiment of the present disclosure, may additionally include a memory region that stores information regarding the number of times all logic level combinations of an address are input, and may perform a smart refresh operation of refreshing word lines that are adjacent to a most frequently activated word line, according to a result of counting all the logic level combinations of the address. Also, the electronic device 3 may store the result of counting all the logic level combinations of the address, and, by using the result, may refresh the word lines that are adjacent to the most frequently activated word line, thereby preventing an interference phenomenon between word lines.

Figure 19:
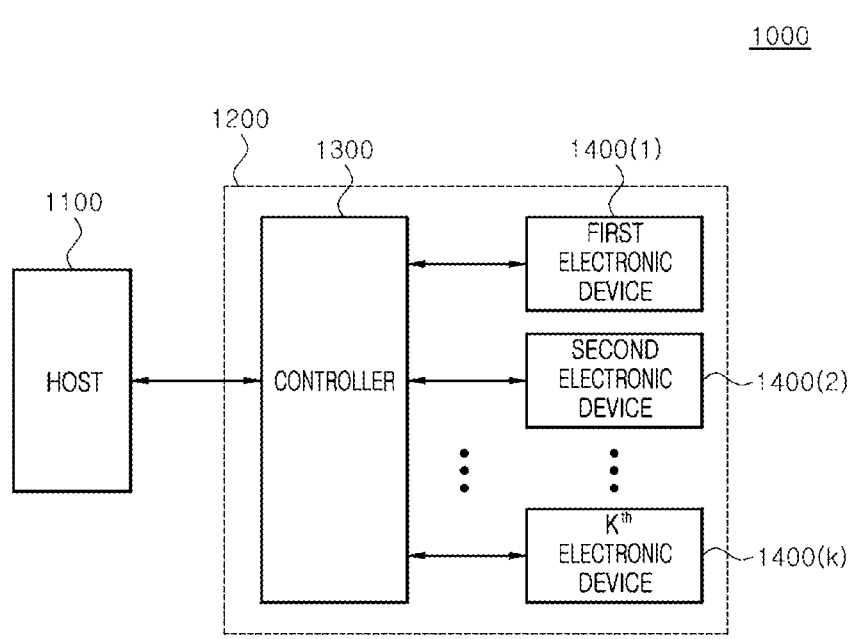
FIG. 19 is a diagram illustrating a configuration of an electronic system to which the electronic device illustrated in FIGS. 1 to 18 is applied.

FIG. 19 is a block diagram illustrating a configuration of an electronic system 1000 in accordance with an embodiment of the present disclosure. As illustrated in FIG. 19, the electronic system 1000 may include a host 1100 and a semiconductor system 1200.

The host 1100 and the semiconductor system 1200 may transmit signals to each other by using an interface protocol. Examples of the interface protocol, used between the host 1100 and the semiconductor system 1200, may include MMC (multimedia card), ESDI (enhanced small disk interface), IDE (integrated drive electronics), PCI-E (peripheral component interconnect-express), ATA (advanced technology attachment), SATA (serial ATA), PATA (parallel ATA), SAS (serial attached SCSI), and USB (universal serial bus).

The semiconductor system 1200 may include a controller 1300 and electronic devices 1400(K:1). The controller 1300 may control the electronic devices 1400(K:1) such that the electronic devices 1400(K:1) perform a smart refresh operation. Each of the electronic devices 1400(K:1) may additionally include a memory region that stores information regarding the number of times all logic level combinations of an address are input and may perform a smart refresh operation of refreshing word lines that are adjacent to a most frequently activated word line, according to a result of counting all the logic level combinations of the address. Each of the electronic devices 1400(K:1) may store the result of counting all the logic level combinations of the address, and, by using the result, may refresh the word lines that are adjacent to the most frequently activated word line, thereby preventing an interference phenomenon between word lines.

Each of the electronic devices 1400(K:1) may be implemented with the electronic device 1, illustrated in FIG. 1, the electronic device 2, illustrated in FIG. 12, and the electronic device 3, illustrated in FIG. 13. According to an embodiment, each of the electronic devices 1400(K:1) may be implemented with one among a DRAM (dynamic random access memory), a PRAM (phase change random access memory), an RRAM (resistive random access memory), an MRAM (magnetic random access memory) and an FRAM (ferroelectric random access memory).

Although some embodiments of the present teachings have been disclosed for illustrative purposes, those skilled in the art will appreciate that various modifications, additions and substitutions are possible, without departing from the scope and spirit of the present teachings as defined in the accompanying claims.

What is claimed is:

1. A memory device comprising:
   a target address generation circuit configured to generate a counting signal by counting the number of times each logic level combination of an address is input by performing an internal read operation and an internal write operation while a word line is activated, configured to store the counting signal as a storage counting signal when the counting signal is up-counted, store the address, corresponding to the counting signal, as a target address, initialize the storage counting signal that is counted most during a first smart refresh operation, and output the target address during a second smart refresh operation; and
   a refresh control circuit configured to control a smart refresh operation on the target address during the second smart refresh operation.

2. The memory device according to claim 1, wherein the target address is a signal generated by storing the address when the same logic level combination of the address is input a preset number of times.

3. The memory device according to claim 1, wherein the first smart refresh operation and the second smart refresh operation are sequentially performed by a refresh command.

4. The memory device according to claim 1, wherein the target address generation circuit is configured to store, as the storage counting signal, the counting signal that is counted the most among the logic level combinations of the address.

5. The memory device according to claim 1, wherein the second smart refresh operation refreshes word lines, among a plurality of word lines that are included in a memory region, which are disposed adjacent to the word line that is selected by the target address.

6. The memory device according to claim 1, wherein the target address generation circuit comprises:
   an input circuit configured to generate a transfer read counting signal based on a read counting signal that is received from the memory region when an internal read signal is input;
   an adder configured to generate the counting signal by up-counting the transfer read counting signal;
   an output circuit configured to, when an internal write signal is input, generate a write counting signal based on the counting signal and output the write counting signal to the memory region;
   a compare circuit configured to generate a flag signal by comparing the counting signal and the storage counting signal, store the counting signal again as the storage counting signal when the flag signal is generated, and initialize the storage counting signal when a reset signal is input; and
   a smart refresh control circuit configured to store the address as a storage address when the flag signal is input, generate the reset signal when a first smart refresh signal is input, and output the storage address as the target address when a second smart refresh signal is input.

7. The memory device according to claim 6, wherein the compare circuit comprises:
   a counting signal storage circuit configured to store the counting signal as the storage counting signal when the flag signal is input and configured to initialize the storage counting signal when the reset signal is input; and
   a flag signal generation circuit configured to generate the flag signal when the counting signal is up-counted more than the stored storage counting signal.

8. The memory device according to claim 6, wherein the smart refresh control circuit comprises:
   a first address storage circuit configured to store the address when the flag signal is input and configured to output the stored address as the storage address when the first smart refresh signal is input;
   a reset control circuit configured to generate the reset signal that is enabled when the first smart refresh signal is input; and
   a second address storage circuit configured to output the storage address as the target address when the second smart refresh signal is input.

9. The memory device according to claim 6, wherein the memory region comprises:
   a first memory region including a plurality of row hammering word lines and a plurality of row hammering cells that are coupled to the plurality of row hammering word lines, configured to output, during the internal read operation, the read counting signal that is stored in row hammering cells, coupled to a row hammering word line, among the plurality of row hammering word lines, selected by an internal address, and configured to store, during the internal write operation, the write counting signal in row hammering cells that are coupled to a row hammering word line, among the plurality of row hammering word lines, selected by the internal address; and
   a second memory region including a plurality of word lines and a plurality of memory cells that are coupled to the plurality of word lines, configured to refresh, when the second smart refresh signal is input, word lines that are adjacent to a word line that is selected by the target address, output first data that is stored in memory cells that are coupled to a word line, among the plurality of word lines, selected by the internal address, during a read operation, and store second data in memory cells that are coupled to a word line, among the plurality of word lines, selected by the internal address, during a write operation.

10. The memory device according to claim 9, further comprising:

an active control circuit configured to, by receiving an active command and a refresh command, generate the internal read signal to control the internal read operation and the internal write signal and generate an internal comparison signal for controlling the internal write operation; and an internal address generation circuit configured to generate the internal address based on the address.

11. The memory device according to claim 10, wherein the active control circuit comprises:

a ring oscillator configured to generate a cycle signal that toggles when any one of the active command and the refresh command is input;

an ROD counter configured to generate an oscillation counting signal that is counted each time a pulse of the cycle signal is input; and an internal signal generation circuit configured to generate the internal read signal when the oscillation counting signal is counted to a first logic level combination, generate the internal write signal when the oscillation counting signal is counted to a second logic level combination, and generate the internal comparison signal when the oscillation counting signal is counted to a third logic level combination.

12. The memory device according to claim 1, wherein the refresh control circuit comprises:

a refresh counter configured to generate a refresh counting signal that is counted according to the number of times the refresh command is input; and a refresh signal generation circuit configured to generate the first smart refresh signal to control the first smart refresh operation when the refresh counting signal is counted to a fourth logic level combination and configured to generate the second smart refresh signal to control the second smart refresh operation when the refresh counting signal is counted to a fifth logic level combination.

* * * * *